(12) United States Patent
Ohta et al.

(10) Patent No.: US 7,208,779 B2
(45) Date of Patent: Apr. 24, 2007

(54) SEMICONDUCTOR DEVICE

(75) Inventors: Masako Ohta, Yokohama (JP);
Tsuneaki Fuse, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 254 days.

(21) Appl. No.: 10/914,128

(22) Filed: Aug. 10, 2004

(65) Prior Publication Data

US 2005/0230751 A1 Oct. 20, 2005

(30) Foreign Application Priority Data

Apr. 16, 2004 (JP) ............................. 2004-122156

(51) Int. Cl.
*H01L 27/10* (2006.01)
*H01L 31/00* (2006.01)
*H01L 21/00* (2006.01)
*H01L 21/8238* (2006.01)
*H01L 25/00* (2006.01)
*G01C 11/00* (2006.01)

(52) U.S. Cl. ....................... 257/207; 257/208; 257/350; 257/357; 257/347; 257/331; 257/401; 257/E29.07; 438/154; 438/199; 327/566; 365/156

(58) Field of Classification Search ................ 257/207, 257/208, 350, 357, 347, 331, 401, E29.027; 438/154, 199; 327/566; 365/156
See application file for complete search history.

(56) References Cited

U.S. PATENT DOCUMENTS 5,072,286 A * 12/1991 Minami et al. ............. 257/208
5,444,275 A * 8/1995 Kugishima et al. ......... 257/206
5,917,342 A * 6/1999 Okamura .................... 326/103
6,118,158 A * 9/2000 Kim ............................ 257/369
6,188,111 B1 * 2/2001 Kumagai .................... 257/369
6,469,328 B2 * 10/2002 Yanai et al. ................ 257/207
6,958,492 B2 * 10/2005 Huang et al. ................. 257/57
6,979,870 B2 * 12/2005 Fuse .......................... 257/371
6,982,460 B1 * 1/2006 Cohen et al. ............... 257/331
2002/0178413 A1 * 11/2002 Parris et al. ................ 714/718
2005/0253197 A1 * 11/2005 Tokushige .................. 257/347

FOREIGN PATENT DOCUMENTS

| JP | 2001-02824 | * | 1/2001 |
| JP | 2001-28424 | | 1/2001 |
| JP | 2001-168338 | * | 6/2001 |
| JP | 2004-79694 | * | 3/2004 |

* cited by examiner

*Primary Examiner*—Howard Weiss
*Assistant Examiner*—Shrinivas H. Rao
(74) *Attorney, Agent, or Firm*—Oblon, Spivak, McClelland, Maier & Neustadt, P.C.

(57) ABSTRACT

A semiconductor device includes a substrate having an active layer, an element region provided in the active layer, a P-type semiconductor region provided in the element region, and first and second N-type semiconductor regions provided in the element region, located on the sides of the P-type semiconductor region, respectively and spaced in a first direction. The device has an N-type MOS transistor and first and second P-type MOS transistors. The N-type MOS transistor has a first gate electrode provided on the P-type semiconductor region. The first P-type MOS transistor has a second gate electrode provided on the first N-type semiconductor region. The second P-type MOS transistor has a third gate electrode provided on the second N-type semiconductor region.

20 Claims, 21 Drawing Sheets

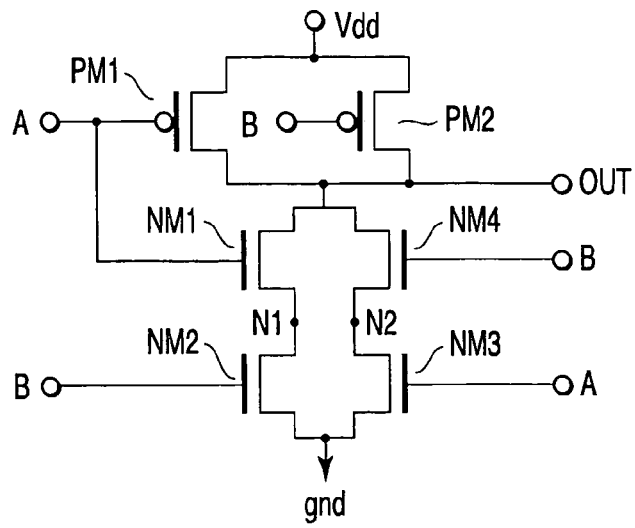
F I G. 1 2
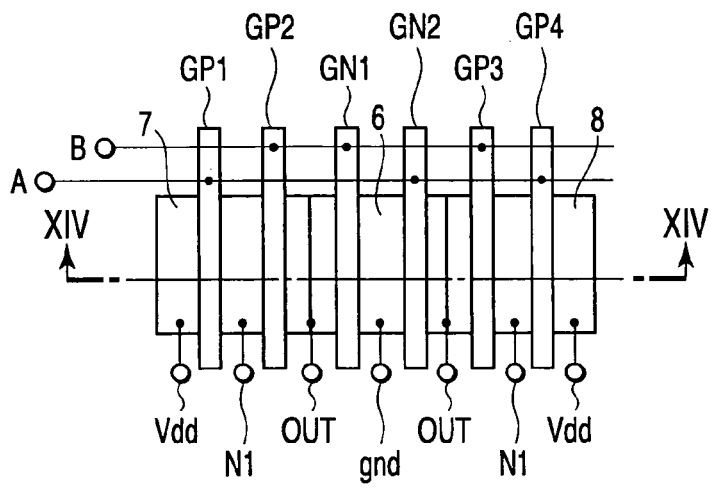
F I G. 1 3
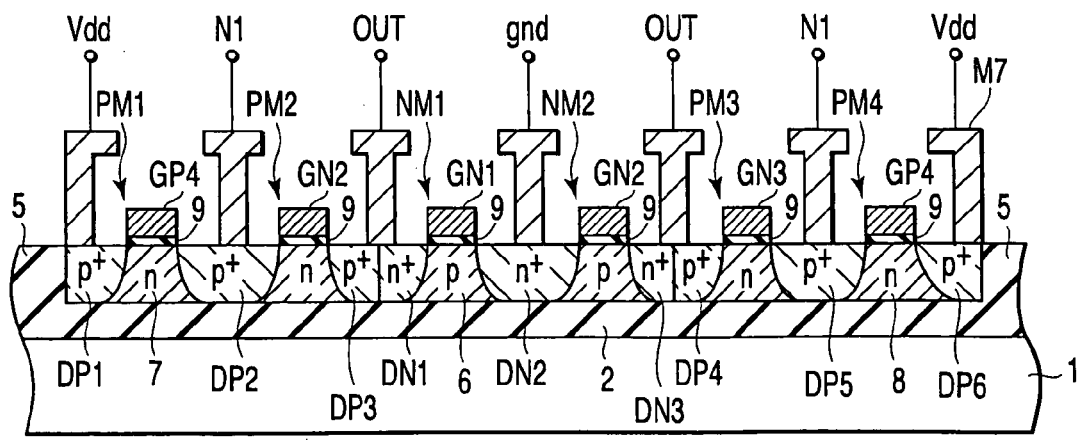
F I G. 1 4

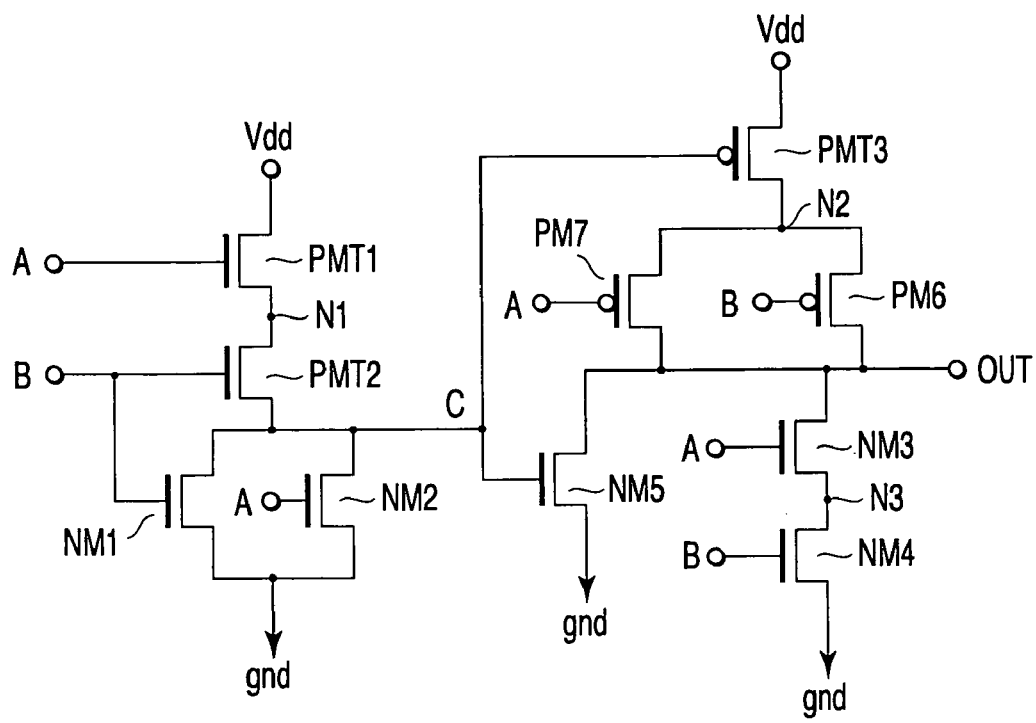
F I G. 33
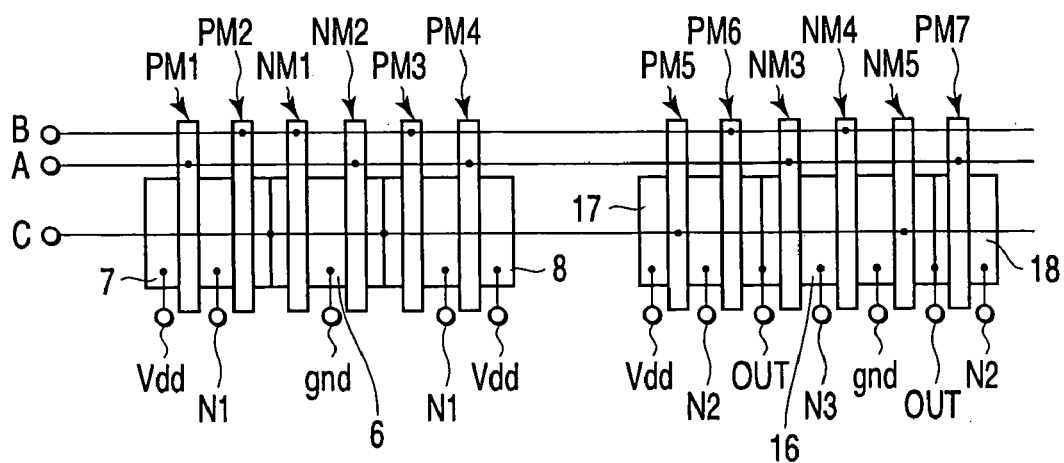
F I G. 34

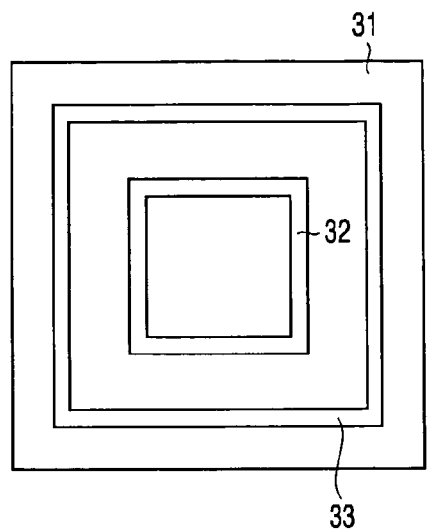
F I G. 49

SEMICONDUCTOR DEVICE

CROSS-REFERENCE TO RELATED APPLICATIONS

This application is based upon and claims the benefit of priority from prior Japanese Patent Application No. 2004-122156, filed Apr. 16, 2004, the entire contents of which are incorporated herein by reference.

BACKGROUND OF THE INVENTION

1. Field of the Invention

The present invention relates to a semiconductor device of SOI (Silicon On Insulator) structure. More particularly, the invention relates to a semiconductor device that has a CMOS (Complementary Metal Oxide Semiconductor) logic circuit.

2. Description of the Related Art

In recent years, the components of the CMOS devices have become smaller as is demanded. To make the components smaller and enhance the operating efficiencies of the components, such as current drivability, so-called scale-down is carried out in accordance with prescribed scaling rules. When the scale-down is performed on any CMOS device, it should be performed also on the element region of the semiconductor substrate and on the element-isolating region of the substrate.

It is pointed out, however, that the performance of the CMOS device changes if the diffusion layers functioning as the source and drain regions of the MOS transistors formed in the element region are narrowed. This change in the performance of the CMOS device results from the stress applied to the element region from the insulators that are formed in the element-isolating region. More specifically, insulators may be embedded in the trenches m in the semiconductor substrate, thus achieving so-called STI (Shallow Trench Isolation). In this case, the insulators apply a compression stress to the element region. The stress changes the mobility of the electrons or holes that are moving in the MOS transistors formed in the element region. Consequently, the performance of the CMOS device will vary.

In the MOS devices available at present, the element region is made of Si and the element-isolating region is made of $SiO_2$-based material such as TEOS (Tetra-Ethyl-Ortho-Silicate). The thermal expansion coefficient of $SiO_2$ is smaller than that of the Si. Hence, the stress from the element-isolating region compresses the element region. That is, the element region is more compressed than the element-isolation region when both regions are cooled from the high heat-treatment temperature to room temperature. In other words, the element region receives a compressing stress from the element-isolating region.

The change in the performance of the MOS transistors, which is caused by the compression stress applied from the element-isolating region, depends on the distance from the element-isolating region, or from either edge of the element region. The characteristics of P-type MOS transistors (hereinafter referred to as PMOS transistors) are inverse to those of the N-type MOS transistors (hereinafter referred to as NMOS transistors), depending on the distance from either edge of the element region. FIG. 50 shows a relation between current drivability and distance from either edge of the element region, for PMOS transistors and NMOS transistors. In FIG. 50, plotted on the horizontal axis is the distance X between the edge of the element region and the gate electrode of each transistor is plotted on the horizontal axis. Plotted on the vertical axis is the ratio ΔIdr of the current drivability of a transistor formed in an element region having a compression stress to that of a transistor formed in an element region having no compression stress. The ratio ΔIdr is 0% when the transistor in the element region with a compression stress has the same current drivability as the transistor in the element region with no compression stress. As evident from FIG. 50, the closer a PMOS transistor is to the edge of the element region, the higher its current drivability. By contrast, the farther a NMOS transistor is to the edge of the element region, the higher its current drivability.

A conventional CMOS device will be described. FIG. 51 is a plan view of an inverter circuit. The semiconductor substrate has two element regions 34 and 35. An element-isolating region 35 surrounds the element region 34. Five gate electrodes 37 are provided on the element region 34. A source and a drain are formed in the two parts of the element region 34, which lie on two sides of each gate electrode 37. Hence, five PMOS transistors PM1 to PM5 are provided in the element region 34. On the element region 35, three gate electrodes 38 are provided. A source and a drain are formed in the two parts of the element region 35, which lie on two sides of each gate electrode 38. Thus, three NMOS transistors NM1 to NM3 are provided in the element region 35.

The gate electrodes 37 and 38 are connected to the input unit IN. The source and drain of each transistor are connected to the power-supply voltage Vdd, the ground voltage gnd, or the output unit OUT. The inverter circuit is thus configured.

In the inverter circuit of FIG. 51, the PMOS transistors are formed in one element region and the NMOS transistors are formed in another element region. In whichever element region they are formed, the transistors differ in current drivability, in accordance with how far they are located from either edge of the element region.

Note that the current drivability of any PMOS transistor is opposite to that of any NMOS transistor and depends on the distance from the either edge of the element region. More precisely, the PMOS transistors PM1 and PM5 that are close to the edges of the element region 34, respectively, have higher current-drive efficiencies than the PMOS transistors PM2 to PM4 that are formed in the center part of the element region 34. By contrast, the NMOS transistors NM2 formed in the center part of the element region 35 has higher current drivability than the NMOS transistors NM1 and NM2 that are close to the edges of the element region 35, respectively.

The PMOS transistors and the NMOS transistors differ from one another in terms of operating characteristic, in accordance with the number of the gate electrodes and the positions thereof. The inverter circuit may fail to operate as is desired. The circuit must be redesigned, overcoming such configuration dependency, in order to operate in a desired manner. Alternatively, the circuit must have some design margin set in consideration of the configuration dependency. Even if these measures are taken, however, the circuit will not acquire desirable characteristics, and its design efficiency is low.

BRIEF SUMMARY OF THE INVENTION

According to a first aspect of this invention, there is provided a semiconductor device that comprises: a substrate having an insulating layer and an active layer provided on the insulating layer; a first element region provided in the active layer; an element-isolating region provided in the active layer, surrounding the first element region and reaching the insulating layer; a P-type semiconductor region provided in the first element region and reaching the insulating layer; first and second N-type semiconductor regions provided in end parts of the P-type semiconductor region, respectively, spaced apart in a first direction, provided in the first element region, and reaching the insulating layer; at least one N-type MOS transistor provided in the P-type semiconductor region and having a first gate electrode provided on the P-type semiconductor region, a direction of a channel length of the N-type MOS transistor substantially corresponding to the first direction; at least one first P-type MOS transistor provided in the first N-type semiconductor region and having a second gate electrode provided on the first N-type semiconductor region, a direction of a channel length of the first P-type MOS transistor substantially corresponding to the first direction; and at least one second P-type MOS transistor provided in the second N-type semiconductor region and having a third gate electrode provided on the second N-type semiconductor region, a direction of a channel length of the second P-type MOS transistor substantially corresponding to the first direction.

According to a second aspect of this invention, there is provided a semiconductor device that comprises: a substrate having an insulating layer and an active layer provided on the insulating layer; an element region provided in the active layer; an element-isolating provided in the active layer, surrounding the element region and reaching the insulating layer; a P-type semiconductor region provided in the element region and reaching the insulating layer; an N-type semiconductor region provided in the element region, surrounding the P-type semiconductor region, and reaching the insulating layer; an N-type MOS transistor provided in the P-type semiconductor region and having a first gate electrode provided on the P-type semiconductor region; and a P-type MOS transistor provided in the N-type semiconductor region and having a second gate electrode provided on the N-type semiconductor region.

According to a third aspect of this invention, there is provided a semiconductor device that comprises: a substrate having an insulating layer and an active layer provided on the insulating layer; an element region provided in the active layer and having a space in a center part; an element-isolating region provided in the active layer and the space of the element region, surrounding the element region and reaching the insulting layer; and a plurality of gate electrodes provided on the element region and extending in radial directions from the center part of the element region.

BRIEF DESCRIPTION OF THE SEVERAL VIEWS OF THE DRAWING

FIG. 12 is an equivalent-circuit diagram of the two-input NAND circuit shown in FIG. 11;

FIG. 13 is a plan view of a two-input NOR circuit according to a fourth embodiment of the present invention;

FIG. 14 is a sectional view of the two-input NOR circuit shown in FIG. 13, taken along line XIV—XIV;

FIG. 33 is an equivalent-circuit diagram of the two-input XOR circuit shown in FIG. 31;

FIG. 34 is a plan view of another two-input XOR circuit;

FIG. 49 is a plan view of a CMOS device identical to the CMOS device of FIG. 47, except that the element region is square;

DETAILED DESCRIPTION OF THE INVENTION

Figure 1:
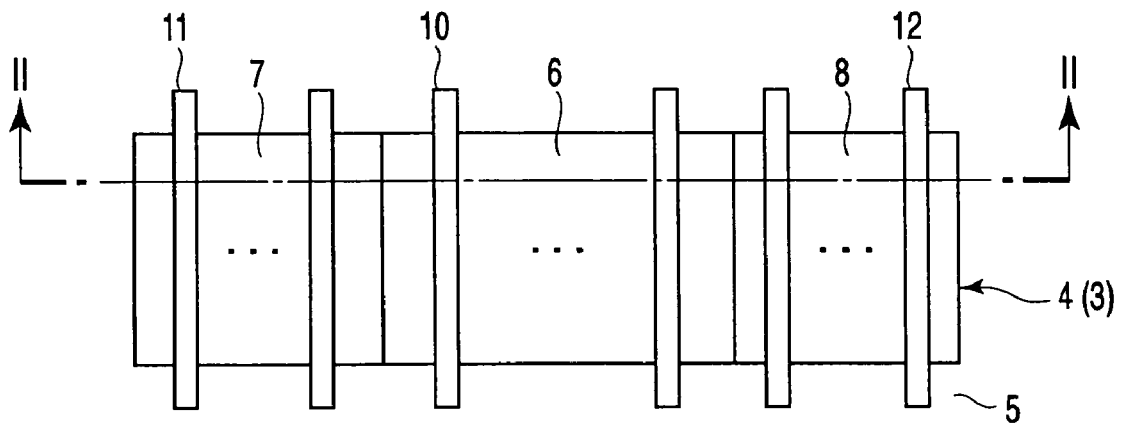
FIG. 1 is a plan view of a CMOS device according to a first embodiment of the present invention.

Embodiments of the present invention will be described, with reference to the accompanying drawings. In the following description, any components that are identical in function and structure will not be repeatedly described, except for some cases, and are designated at the same reference numeral in the drawings.

First Embodiment

Figure 2:
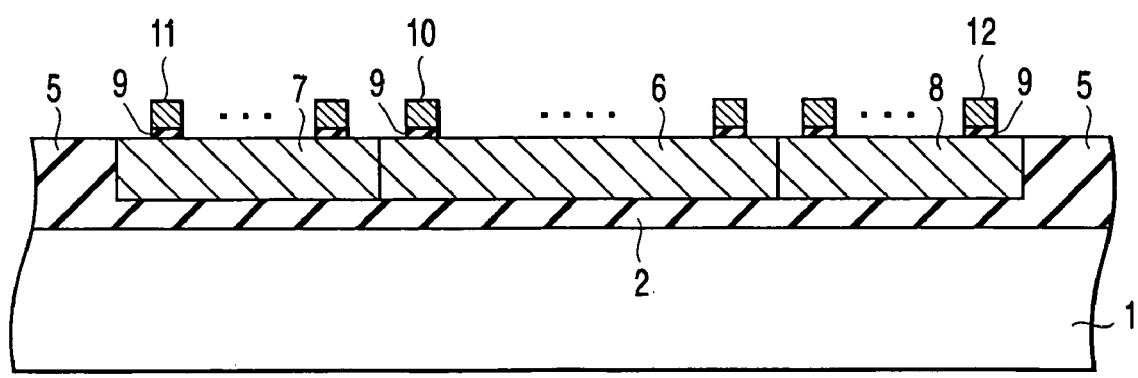
FIG. 2 is a sectional view of the COMS device shown in FIG. 1, taken along line II—II.

FIG. 1 is a plan view of a CMOS device according to the first embodiment of the present invention. FIG. 2 is a sectional view of the COMS device shown in FIG. 1, taken along line II—II.

As FIG. 2 shows, a buried insulating layer 2 is formed in the surface of the substrate 1. The substrate 1 is made of, for example, Si. The buried insulating layer 2 is made of, for example, $SiO_2$. An active layer 3 (e.g., an Si layer) is provided on the buried insulating layer 2. Thus, an SOI (Silicon On Insulator) substrate is provided. The SOI substrate has been formed by means of, for example, SIMOX (Separation by Implanted OXygen).

A trench is made in the surface of the Si layer 3 of the SOI substrate, reaching the buried insulating layer 2. The trench is filled with insulating material such as $SiO_2$, thus forming an element-isolating region 5. The element-isolating region 5 surrounds an element region 4.

In the center part of the element region 4, a P-type semiconductor region 6 is provided, in which NMOS transistors will be formed. The P-type semiconductor region 6 is a region that has been formed by diffusing P-type impurities in a low concentration. A plurality of gate insulating films 9 are provided on the P-type semiconductor region 6. Gate electrodes 10 are provided on the gate insulating films 9, respectively. The gate electrodes 10 are made of, for example, polycrystalline silicon.

In the element region 4, two N-type semiconductor regions 7 and 8 are provided on the opposite sides of the P-type semiconductor region 6, respectively. The regions 7 and 8 are spaced apart in direction L. The direction of the channel length of the transistor that will be formed and will have the gate electrode 10 corresponds to direction L. Both N-type semiconductor regions 7 and 8 are regions formed by diffusing N-type impurities at low concentration. Gate insulating films 9 are provided on the N-type semiconductor region 7. Gate electrodes 11 are provided on the gate insulating films 9, respectively. The gate electrodes 11 are arranged parallel to the gate electrodes 10 provided on the P-type semiconductor region 6. The gate electrodes 11 therefore extend in direction L, like the gate electrodes 10. Gate insulating films 9 are provided on the N-type semiconductor region 8. Gate electrodes 12 are provided on the gate insulating films 9, respectively. The gate electrodes 12 are arranged parallel to the gate electrodes 10 provided on the P-type semiconductor region 6.

A source and a drain are formed on the sides of each gate electrode 10, respectively. A plurality of NMOS transistors are thereby formed in the P-type semiconductor region 6. Further, a source and a drain are formed on the sides of each gate electrode 11, respectively. A plurality of PMOS transistors are thereby formed in the N-type semiconductor region 7, and a plurality of PMOS transistors are thereby formed in the N-type semiconductor region 8. The gate electrodes of the NMOS transistors and PMOS transistors, thus formed, can be connected in any manner desired. In other words, the gate electrodes may be short-circuited or connected to receive the inputs to the CMOS device. The source and drains of the NMOS and PMOS transistors can be connected in any manner desired, too. Only one gate electrode may be provided on each semiconductor region, not a plurality of gate electrodes as is illustrated in FIGS. 1 and 2.

In FIG. 1, the NMOS transistors formed in the P-type semiconductor region 6 constitute an N block, the PMOS formed in the N-type semiconductor region 7 constitute a P1 block, and the PMOS formed in the N-type semiconductor region 8 constitute a P2 block. The N block exists in the center part of the CMOS device. The blocks P1 and P2 are arranged on the sides of the N block, respectively, and spaced apart in direction L. Thus, the N block is sandwiched between the P1 block and the P2 block. Hereinafter, the CMOS device of this P1 block/N block/P2 block structure will be referred to as "basic cell."

Figure 3:
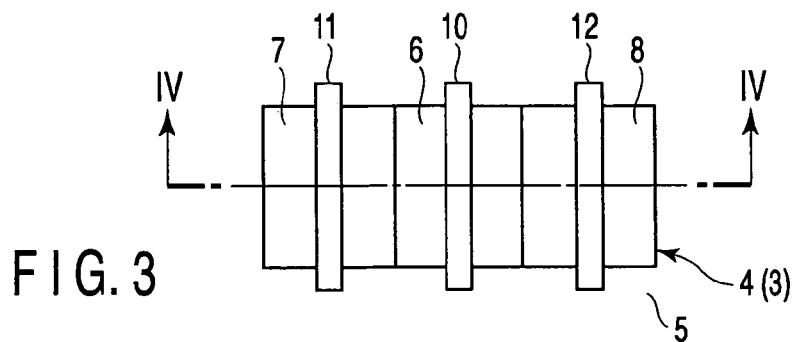
FIG. 3 is a plan view of a CMOS device that has one NMOS transistor formed in a P-type semiconductor region 6 and two PMOS transistors formed in N-type semiconductor regions 7 and 8, respectively.
Figure 4:
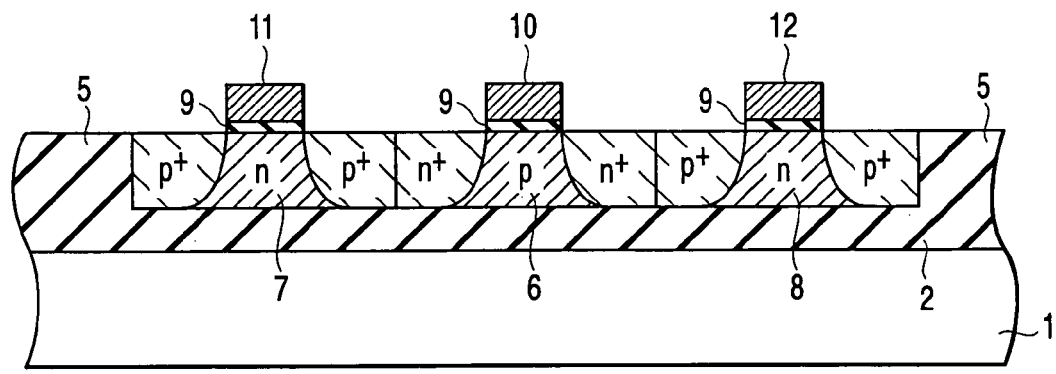
FIG. 4 is a sectional view of the CMOS device shown in FIG. 3, taken along line IV—IV.

FIG. 3 is a plan view of a CMOS device that has one NMOS transistor formed in a P-type semiconductor region 6 and two PMOS transistors formed in N-type semiconductor region 7 and 8, respectively. FIG. 4 is a sectional view of the CMOS device shown in FIG. 3, taken along line IV—IV.

This CMOS device has one P-type semiconductor region 6 and two N-type semiconductor regions 7 and 8. The regions 7 and 8 sandwich the region 6. Three gate electrodes 10, 11 and 12 are provided on the semiconductor regions 6, 7 and 8, respectively. In the P-type semiconductor region 6, two $n^+$ diffusion layers (i.e., source and drain) are provided, respectively on the sides of the gate electrode 10. Thus, an NMOS transistor is formed in the P-type semiconductor region 6. In the N-type semiconductor region 7, two $p^+$ diffusion layers (i.e., source and drain) are provided, respectively on the sides of the gate electrode 11. In the N-type semiconductor region 8, too, $p^+$ diffusion layers (i.e., source and drain) are provided, respectively on the sides of the gate electrode 12. Thus, two PMOS transistors are formed in the N-type semiconductor regions 7 and 8, respectively.

As FIG. 4 shows, the source or drain of the NMOS transistor is not electrically insulated from the source or drain of adjacent PMOS transistor, by an element-insulating region. A PN junction is formed at the interface between the drain of the NMOS transistor and the source of the PMOS transistor. Note that the diffusion layers forming either PN junction are at the same potential.

The CMOS device thus configured has one NMOS transistor in the center part of the element region 4. It has two PMOS transistors respectively in the edge parts of the element region 4. That is, the NMOS transistor is formed in that part of the element region, where no compression stress is applied from element-isolating regions, and the PMOS transistors are formed in those parts of the element region, where a compression stress is applied from the element-isolating regions.

In this embodiment, the carrier mobility can be increased in the NMOS transistor and the PMOS transistors. As a result, the NMOS transistor and the PMOS transistor can have high operating efficiency. The CMOS device can therefore have a high operating efficiency.

Second Embodiment

Figure 5:
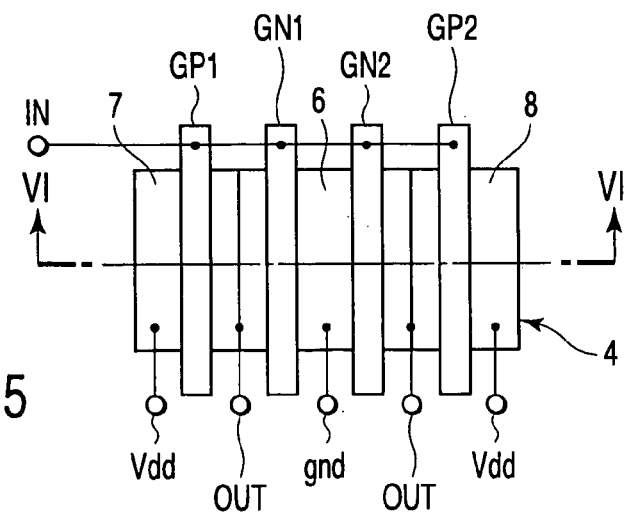
FIG. 5 is a plan view of an inverter circuit according to a second embodiment of this invention.
Figure 6:
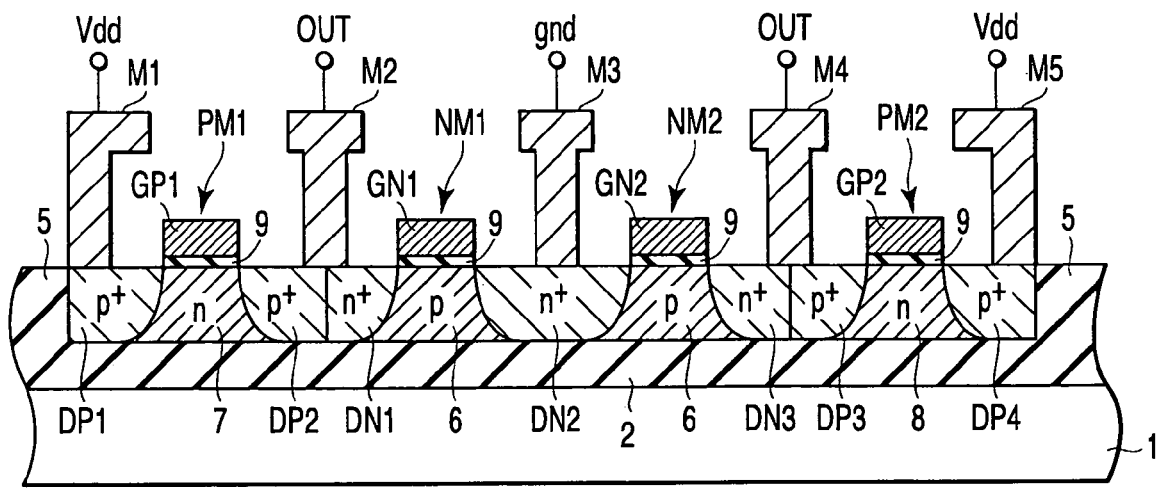
FIG. 6 is a sectional view of the inverter circuit shown in FIG. 5, taken along line VI—VI.
Figure 7:
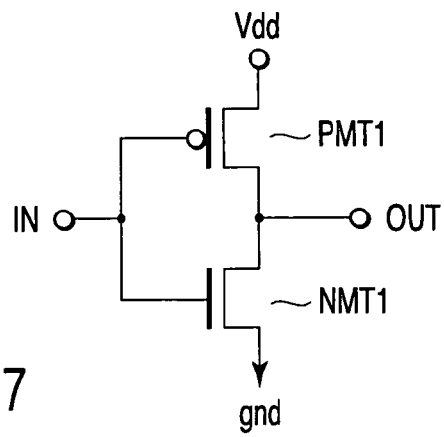
FIG. 7 is an equivalent-circuit diagram of the inverter circuit depicted in FIG. 5.

FIG. 5 is a plan view of an inverter circuit that is the second embodiment of the present invention. FIG. 6 is a sectional view of the inverter circuit shown in FIG. 5, taken along line VI—VI. FIG. 7 is an equivalent-circuit diagram of the inverter circuit depicted in FIG. 5. In FIG. 5, the wiring is represented in a simplified fashion.

As FIG. 6 shows, gate insulating films 9 are provided on a P-type semiconductor region 6, and gate electrodes GN1 and GN2 are provided on the gate insulating films 9, respectively. Another insulating film 9 is provided on an N-type semiconductor region 7, and a gate electrode GP1 is provided on this gate insulating film 9. Similarly, another insulating film 9 is provided on an N-type semiconductor region 8, and a gate electrode GP2 is provided on this gate insulating film 9.

In the P-type semiconductor region 6, two NMOS transistors NM1 and NM2 are provided. The NMOS transistor NM1 has the gate electrode GN1, and the NMOS transistor NM2 has the gate electrode GN2. In the N-type semiconductor region 7, a PMOS transistor PM1 is provided. In the N-type semiconductor region 8, a PMOS transistor PM2 is provided.

More specifically, in the P-type semiconductor region 6, two n$^+$ diffusion layers DN1 (drain) and DN2 (source) are provided, on the sides of the gate electrode GN1, respectively. Also, in the P-type semiconductor region 6, two n$^+$ diffusion layers DN2 (source) and DN3 (drain) are provided, on the sides of the gate electrode GN2, respectively. In other words, the source of the NMOS transistor NM1 and the source of the NMOS transistor NM2 are constituted by the same diffusion layer. In the N-type semiconductor region 7, two p$^+$ diffusion layers DP1 (source) and DP2 (drain) are provided, on the sides of the gate electrode GP1, respectively. In the N-type semiconductor region 8 two p$^+$ diffusion layers DP3 (drain) and DP4 (source) are provided, on the sides of the gate electrode GP2, respectively.

The gate electrodes GN1, GN2, GP1 and GP2 are connected to the input section IN. A wire M1 connects the p$^+$ diffusion layers DP1 to the power-supply voltage Vdd. A wire M2 connects the p$^+$ diffusion layers DP2 and n$^+$ diffusion layer DN1 to the output section OUT. A wire M3 connects the n$^+$ diffusion layer DN2 to the ground voltage gnd. A wire 4 connects the n$^+$ diffusion layer DN3 and p$^+$ diffusion layer DP3 to the output section OUT. A wire M5 connects the p$^+$ diffusion layer DP4 to the power-supply voltage Vdd.

In the CMOS device thus configured, two transistors NM1 and NM2 constitute a NMOS transistor NMT1, and two transistors PM1 and PM2 constitute a PMOS transistor PMT1. Thus, the transistors NMT1 and PMT1 constitute an inverter circuit.

In this embodiment described above, the gate electrode of the NMOS transistor NMT1 is cut into halves, which are arranged in the P-type semiconductor region 6, when the NMOS transistor NMT1 and the PMOS transistor PMT1 are combined to provide the inverter circuit. Further, the gate electrode of the PMOS transistor PMT1 is cut into halves, which are arranged in the N-type semiconductor regions 7 and 8, respectively.

Thus, the carrier mobility can be increased in the NMOS transistors and PMOS transistors in the present embodiment. As a result of this, the NMOS transistors and the PMOS transistors can have high operating efficiency. These transistors therefore constitute an inverter circuit that can operate at high efficiency.

The NMOS transistors NM1 and NM2 are located symmetrical to each other with respect of the centerline. The PMOS transistors PM1 and PM2 are located symmetrical to each other with respect to the centerline, too. This helps the CMOS device to have operating characteristics similar to the design characteristics.

The NMOS transistor NMT1 provided in the P-type semiconductor region 6 may have an even number of gate electrodes, or at least two gate electrodes.

Third Embodiment

Figure 8:
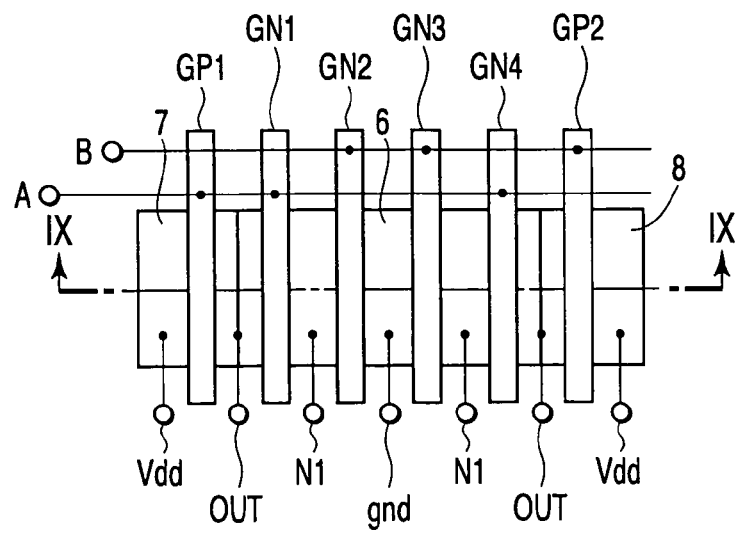
FIG. 8 is a plan view of a two-input NAND circuit according to a third embodiment of this invention.
Figure 9:
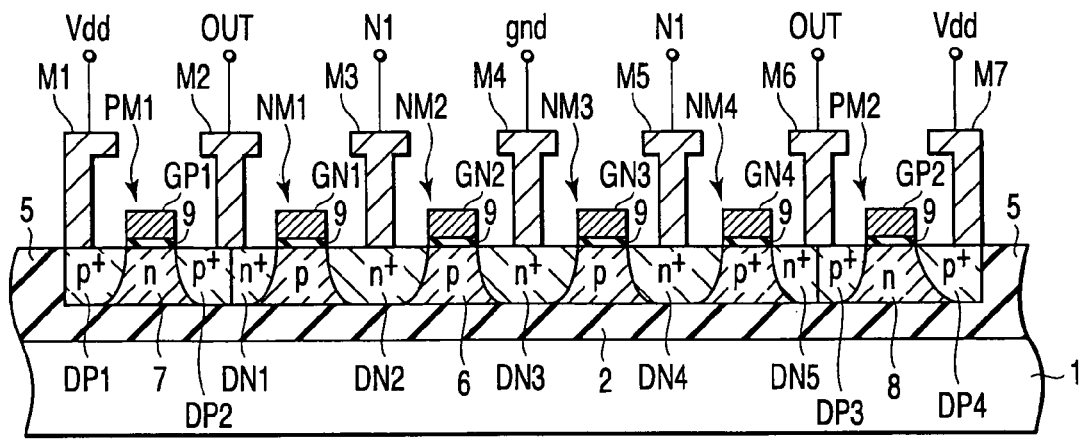
FIG. 9 is a sectional view of the two-input NAND circuit shown in FIG. 8, taken along line IX—IX.
Figure 10:
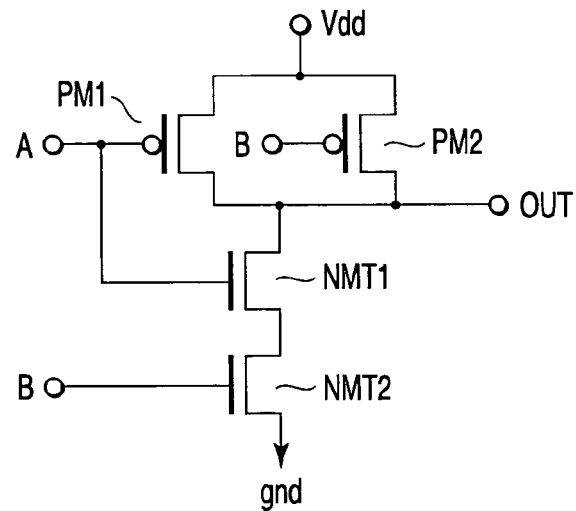
FIG. 10 is an equivalent-circuit diagram of the two-input NAND circuit illustrated in FIG. 8.

FIG. 8 is a plan view of a two-input NAND circuit that is the third embodiment of the present invention. FIG. 9 is a sectional view of the two-input NAND circuit shown in FIG. 8, taken along line IX—IX. FIG. 10 is an equivalent-circuit diagram of the two-input NAND circuit shown in FIG. 8. In FIG. 8, the wiring is represented in a simplified fashion.

As illustrated in FIG. 9, gate insulating films 9 are provided on a P-type semiconductor region 6. Gate electrodes GN1, GN2, GN3 and GN4 are provided on the gate insulating films 9, respectively. A gate insulting film 9 is provided on an N-type semiconductor region 7, and a gate electrode GP1 is provided on this gate insulating film 9. Similarly, a gate insulting film 9 is provided on an N-type semiconductor region 8, and a gate electrode GP2 is provided on the gate insulating film 9.

Four NMOS transistors NM1 to NM4 are provided in the P-type semiconductor region 6. The NMOS transistors NM1 to NM4 have the gate electrodes GN1, GN2, GN3 and GN4, respectively. A PMOS transistor PM1 that has the gate electrode GP1 is provided in the N-type semiconductor region 7. Another PMOS transistor PM2 that has the gate electrode GP2 is provided in the N-type semiconductor region 8.

To be more specific, in the P-type semiconductor region 6, n$^+$ diffusion layers DN1 (drain) and DN2 (source) are provided on the sides of the gate electrode GN1, respectively. In the P-type semiconductor region 6, too, the n$^+$ diffusion layer DN2 (drain) and an n$^+$ diffusion layer DN3 (source) are provided on the sides of the gate electrode GN2, respectively. Thus, the source of the NMOS transistor NM1 and the drain of the NMOS transistor MN2 are constituted by the same diffusion layer. In the P-type semiconductor region 6, too, the n$^+$ diffusion layer DN3 (source) and an n$^+$ diffusion layer DN4 (drain) are provided on the sides of the gate electrode GN3, respectively. The sources of the NMOS transistors NM2 and NM3 are therefore constituted by the same diffusion layer. Also in the P-type semiconductor region 6, the n+ diffusion layer DN4 (source) and an n+ diffusion layer DN5 (drain) are provided on the sides of the gate electrode GN4, respectively. Thus, the drain of the NMOS transistor NM3 and the source of the NMOS transistor MN4 are constituted by the same diffusion layer.

In the N-type semiconductor region 7, p+ diffusion layers DP1 (source) and DP 2 (drain) are provided on the sides of the gate electrode GP1, respectively. In the N-type semiconductor region 8, p+ diffusion layers DP3 (drain) and DP4 (source) are provided on the sides of the gate electrode GP2, respectively.

The gate electrodes GN1, GN4 and GP1 are connected to the input section A. The gate electrodes GN2, GN3 and GP2 are connected to an input section B.

A wire M1 connects the p+ diffusion layers DP1 to the power-supply voltage Vdd. A wire M2 connects the p+ diffusion layers DP2 and n+ diffusion layers DN1 to the output section OUT. A wire M3 connects the n+ diffusion layers DN2 to a node N1. A wire M4 connects the n+ diffusion layers DN3 to the ground voltage gnd. A wire M5 connects the n+ diffusion layers DN4 to the node N1. A wire M6 connects the n+ diffusion layers DN5 and p+ diffusion layer DP3 are connected to the output section OUT. A wire M7 connects the p+ diffusion layer DP4 to the power-supply voltage Vdd.

In the CMOS device thus configured, the NMOS transistors NM1 and NM4 constitute an NMOS transistor MNT1, and the NMOS transistors NM2 and NM3 constitute an NMOS transistor NMT2. The NMOS transistors NMT1 and NMT2 and the PMOS transistors PM1 and PM2 constitute a two-input NAND circuit.

In the third embodiment described above, the gate electrode of the NMOS transistor NMT1 is cut into halves, which are arrange in the P-type semiconductor region 6 and extend in direction L, when the NMOS transistors NMT1 and NMT2 and the PMOS transistor PMT1 are combined to provide the two-input NAND circuit. Further, the gate electrode of the PMOS transistor PMT2 is cut into halves, which are arranged between the two gate electrodes of the NMOS transistor NMT1. The PMOS transistors PM1 and PM2 are arranged in the N-type semiconductor regions 7 and 8, respectively.

Therefore, the carrier mobility can be increased in the NMOS transistors and PMOS transistors in the third embodiment. As a result of this, the NMOS transistors and the PMOS transistors can have high operating efficiency. Hence, these transistors constitute a two-input NAND circuit that can operate at high efficiency.

The NMOS transistor NMT1 formed in the P-type semiconductor region 6 may have any even number of gate electrodes, at least four gate electrodes.

Figure 11:
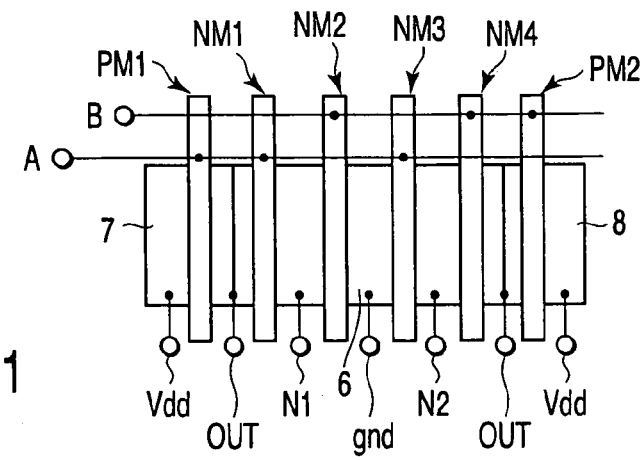
FIG. 11 is a plan view depicting another two-input NAND circuit.

Another two-input NAND circuit according to the third embodiment of the invention will be described. FIG. 11 is a plan view of this two-input NAND circuit. FIG. 12 is an equivalent-circuit diagram of the two-input NAND circuit shown in FIG. 11. No sectional view of this two-input NAND circuit is given, because the circuit of FIG. 11 has the same structure as shown in FIG. 9, except for the wiring.

The two-input NNAD circuit of FIG. 11 is characterized in that the NMOS transistors are arranged symmetrical with respect to two input sections A and B, from those ends of the element region 4 which are spaced part in direction L. Since the NMOS transistors are so arranged, the circuit exhibits almost the same characteristics as designed, in spite of configuration dependency.

As the equivalent-circuit diagram (i.e., FIG. 12) shows, the NMOS transistors NM1 and NM2 that are connected in series are connected in parallel to the NMOS transistors NM3 and NM4 that are connected in series. Thus, the gate electrodes of these transistors are arranged symmetrical with respect to the input sections A and B. That is, as FIG. 11 shows, the NMOS transistor connected to the input section A has the second gate electrode counted from the left end (FIG. 11), and the third gate electrode counted from the right end. And the NMOS transistor connected to the input section B has the third gate electrode counted from the left end and the second gate electrode counted from the right end. The NMOS transistors can therefore be symmetrical with respect to two input sections A and B, from both ends of the element region 4.

Hence, this two-input NAND circuit can not only achieve the same advantage as the two-input NAND circuit of FIG. 8, but also perform its function whichever logic value the two inputs have.

Fourth Embodiment

Figure 15:
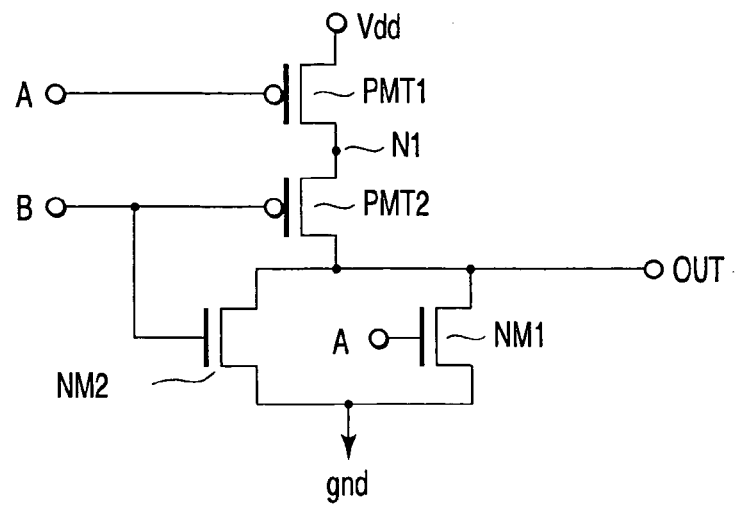
FIG. 15 is an equivalent-circuit diagram of the two-input NOR circuit illustrated in FIG. 13.

FIG. 13 is a plan view of a two-input NOR circuit that is the fourth embodiment of the present invention. FIG. 14 is a sectional view of the two-input NOR circuit shown in FIG. 13, taken along line XIV—XIV. FIG. 15 is an equivalent-circuit diagram of the two-input NOR circuit illustrated in FIG. 13. In FIG. 13, the wiring is represented in a simplified fashion.

As FIGS. 13 and 14 depict, the fourth embodiment has a P-type semiconductor region 6 and two N-type semiconductor regions 7 and 8. Gate electrodes GN1 and GN2 are provided on the P-type semiconductor region 6 via gate insulating films 9, respectively. Gate electrodes GP1 and GP2 are provided on the N-type semiconductor region 7 via gate insulating films 9, respectively. Gate electrodes GP3 and GP4 are provided on the N-type semiconductor region 8 via gate insulating films 9, respectively.

In the P-type semiconductor region 6, two NMOS transistors NM1 and NM2 are provided. The NMOS transistor NM1 has the gate electrode GN1, and the NMOS transistor NM2 has the gate electrode GN2. In the N-type semiconductor region 7, two PMOS transistors PM1 and PM2 are provided. The PMOS transistor PM1 has the gate electrode GP1, and the PMOS transistor PM2 has the gate electrode GP2. In the N-type semiconductor region 8, two PMOS transistors PM3 and PM4 are provided. The PMOS transistor PM3 has the gate electrode GP3, and the PMOS transistor PM4 has the gate electrode GP4.

More precisely, in the P-type semiconductor region 6, n+ diffusion layers DN1 (drain) and DN2 (source) are provided on the sides of the gate electrode GN1, respectively. In the P-type semiconductor region 6, too, the n+ diffusion layer DN2 (source) and an n+ diffusion layer DN3 (drain) are provided on the sides of the gate electrode GN2, respectively. Thus, the source of the NMOS transistor NM1 and the source of the NMOS transistor MN2 are constituted by the same diffusion layer.

In the N-type semiconductor region 7, p+ diffusion layers DP1 (source) and DP2 (drain) are provided on the sides of the gate electrode GP1, respectively. In the P-type semiconductor region 8, too, the p+ diffusion layer DP2 (source) and a p+ diffusion layer DP3 (drain) are provided on the sides of the gate electrode GP2, respectively. Thus, the drain of the PMOS transistor PM1 and the source of the PMOS transistor PM2 are constituted by the same diffusion layer. In the N-type semiconductor region 8, other p+ diffusion layers DP4 (drain) and DP5 (source) are provided on the sides of the gate electrode GP3, respectively. In the N-type semiconductor region 8, the p+ diffusion layers DP5 (drain) and DP6 (source) are provided on the sides of the gate electrode GP4, respectively. Thus, the source of the PMOS transistor PM3 and the drain of the PMOS transistor PM4 are constituted by the same diffusion layer.

The gate electrodes GN2, GP1 and GP4 are connected to the input section A. The gate electrodes GN1, GP2 and GP3 are connected to the other input section B.

A wire M1 connects the p+ diffusion layers DP1 to the power-supply voltage Vdd. A wire M2 connects the p+ diffusion layer DP2 to a node N1. A wire M3 connects the p+ diffusion layer DP3 and n+ diffusion layer DN1 to the output section OUT. A wire M4 connects the n+ diffusion layer DN2 to the ground voltage gnd. A wire M5 connects the n+ diffusion layer DN3 and p+ diffusion layer DP4 to the output section OUT. A wire M6 connects the p+ diffusion layer DP5 to the node N1. A wire M7 connects the p+ diffusion layer DP6 to the power-supply voltage Vdd.

In the CMOS device thus configured, the transistors PM1 and PM4 constitute a PMOS transistor PMT1, and the PMOS transistors PM2 and PM3 constitute a PMOS transistor PMT2. As a result, the NMOS transistors NM1 and NM2 and PMOS transistors PMT1 and PMT2 constitute a two-input NOR circuit as is illustrated in FIG. 15.

In the fourth embodiment described above, the gate electrode of the PMOS transistor PMT1 is cut into halves, which are arranged on those parts of the N-type semiconductor regions 7 and 8, which are ends of the element region 4. Thus, the NMOS transistors MN1 and NM2 and PMOS transistors PMT1 and PMT2 constitute a two-input NOR circuit. Further, the gate electrode of the PMOS transistor PMT2 is cut into halves, which are arranged on those parts of the N-type semiconductor regions 7 and 8, which are close to the P-type semiconductor region 6. Moreover, the NMOS transistors NM1 and NM2 are provided in the P-type semiconductor region 6.

Therefore, the carrier mobility can be increased in the NMOS transistors and PMOS transistors in the fourth embodiment. The NMOS transistors and the PMOS transistors can thus have high operating efficiency. Hence, these transistors constitute a two-input NOR circuit that can operate at high efficiency.

The P-type semiconductor region 6 may have an even number of NMOS transistors, or at least two NMOS transistors. (That is, the region 6 may have an even number of gate electrodes, or at least two adjacent gate electrodes.) The N-type semiconductor region 7 or the N-type semiconductor region 8, or both, may have at least two PMOS transistors (that is, at least two adjacent gate electrodes).

Figure 16:
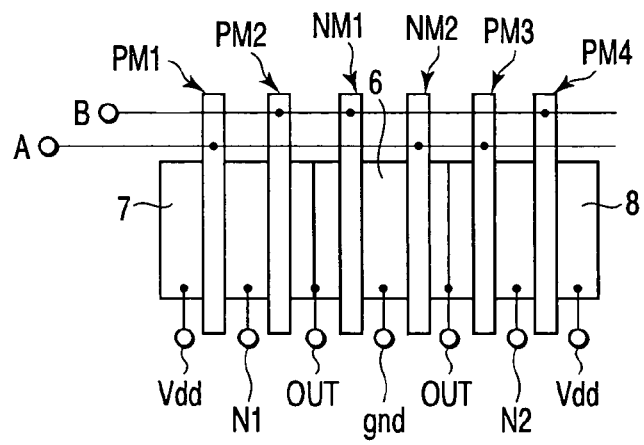
FIG. 16 is a plan view showing another two-input NOR circuit.
Figure 17:
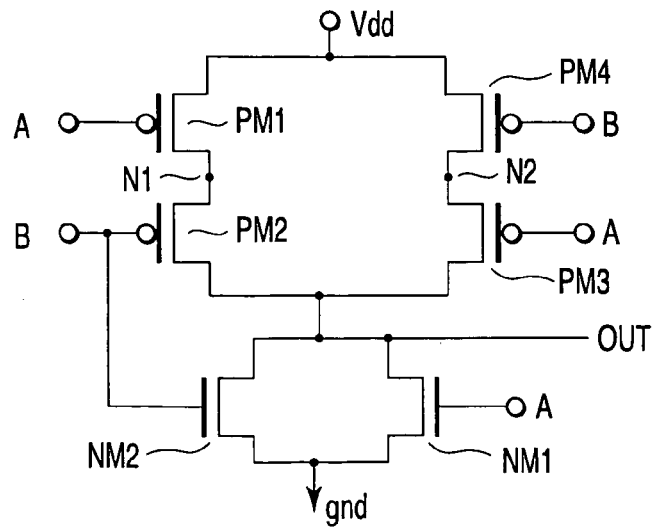
FIG. 17 is an equivalent-circuit diagram of the two-input NOR circuit depicted in FIG. 16.

Another two-input NOR circuit according to the fourth embodiment will be described. FIG. 16 is a plan view showing this two-input NOR circuit. FIG. 17 is an equivalent-circuit diagram of the two-input NOR circuit depicted in FIG. 16. No sectional view of this two-input NAND circuit is presented, because the circuit of FIG. 16 has the same structure as shown in FIG. 14, except for the wiring.

The two-input NOR circuit of FIG. 16 is characterized in that the PMOS transistors are arranged symmetrical with respect to two input sections A and B, from those ends of the element region 4 which are spaced part in direction L. Since the NMOS transistors are so arranged, the circuit has almost the same characteristics as designed, in spite of configuration dependency.

As the equivalent-circuit diagram (i.e., FIG. 17) shows, the PMOS transistors PM1 and PM2 that are connected in series are connected in parallel to the PMOS transistors PM3 and PM4 that are connected in series. Thus, the gate electrodes of these transistors are arranged symmetrical with respect to the input sections A and B. In other words, as FIG. 16 shows, the PMOS transistors connected to the input section A have the first gate electrode counted form the left end and the second gate electrode counted from the right. And the PMOS transistors connected to the input section B have the second gate electrode counted from the left end and the first gate electrode counted from the right end. The PMOS transistors can therefore be positioned symmetrical with respect to two input sections A and B, from both ends of the element region 4.

Hence, this two-input NOR circuit can not only achieve the same advantage as the two-input NOR circuit of FIG. 13, but also perform its function whichever logic value the two inputs have.

Figure 18:
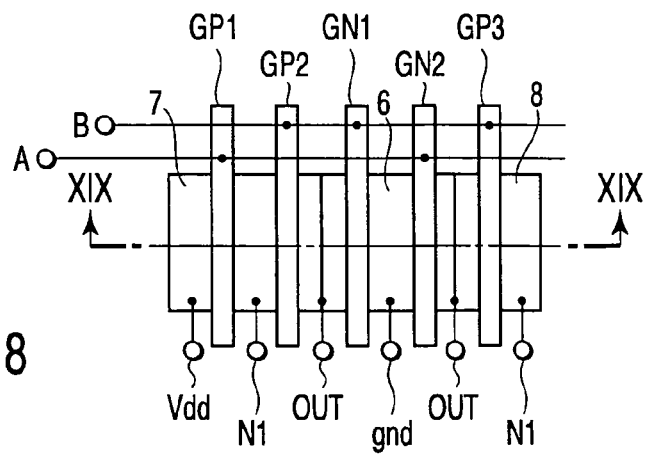
FIG. 18 is a plan view of still another two-input NOR circuit.
Figure 19:
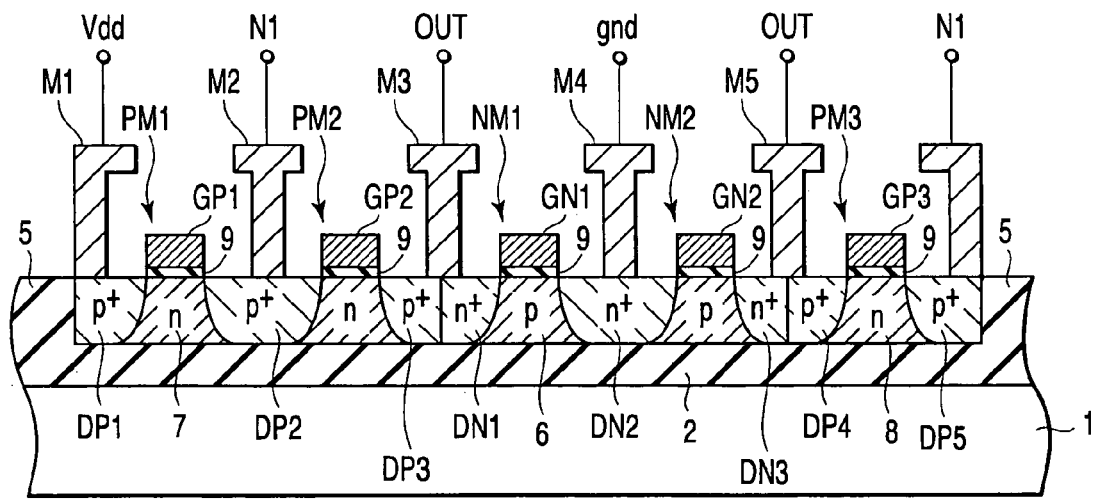
FIG. 19 is a sectional view of the two-input NOR circuit shown in FIG. 18, taken along line XIX—XIX.

Still another two-input NOR circuit will be described. FIG. 18 is a plan view of this two-input NOR circuit. FIG. 19 is a sectional view of the two-input NOR circuit shown in FIG. 18, taken along line XIX—XIX.

The two-input NOR circuit of FIG. 18 differs in that the number of PMOS transistors is one less than in the two-input NOR circuit of FIG. 13. That is, the PMOS transistor connected to the input section A is constituted by one PMOS transistor PM1, whereas the PMOS transistor connected to the input section B is constituted by two PMOS transistors PM2 and PM3.

The two-input NOR circuit of FIG. 18 can be identical in structure to the circuit illustrated in the equivalent-circuit diagram of FIG. 15. Further, the NMOS transistors can be formed in the center part of the element region 4, and the PMOS transistors can be formed in the end parts of the element region 4. This helps to enhance the performance of the NMOS transistors and PMOS transistors. Hence, these transistors constitute a two-input NOR circuit that can operate at high efficiency.

Moreover, the number of the gate electrodes is one less than in the two-input NOR circuit of FIG. 13. The two-input NOR circuit of FIGS. 18 and 19 can, therefore, be more simple in structure.

Fifth Embodiment

Figure 20:
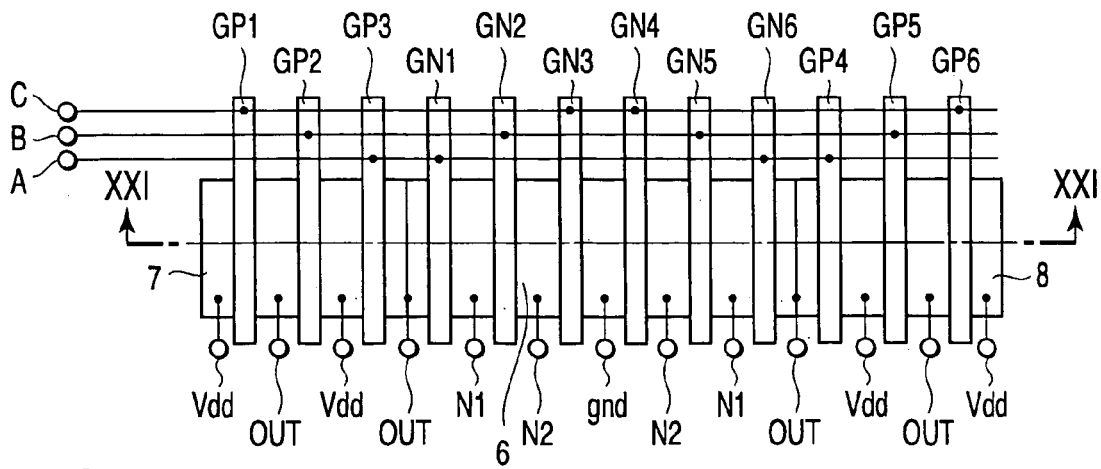
FIG. 20 is a plan view of a three-input NAND circuit according to a fifth embodiment of the present invention.
Figure 21:
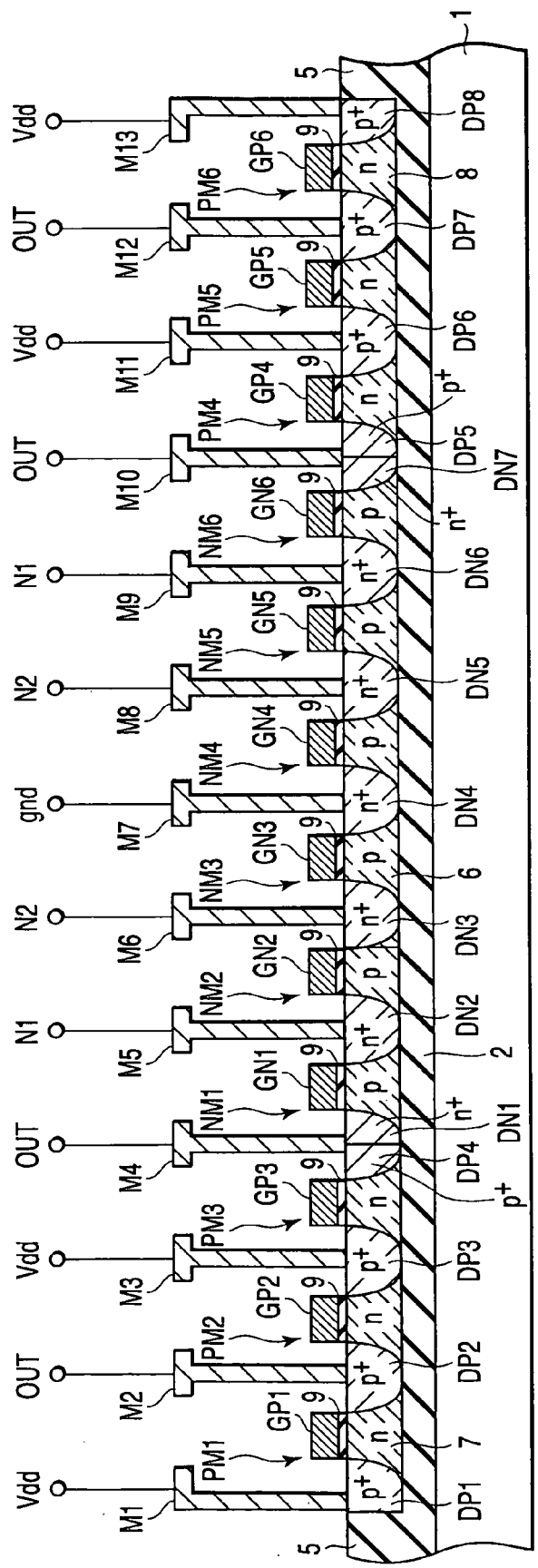
FIG. 21 is a sectional view of the three-input NAND circuit depicted in FIG. 20, taken along line XXI—XXI.
Figure 22:
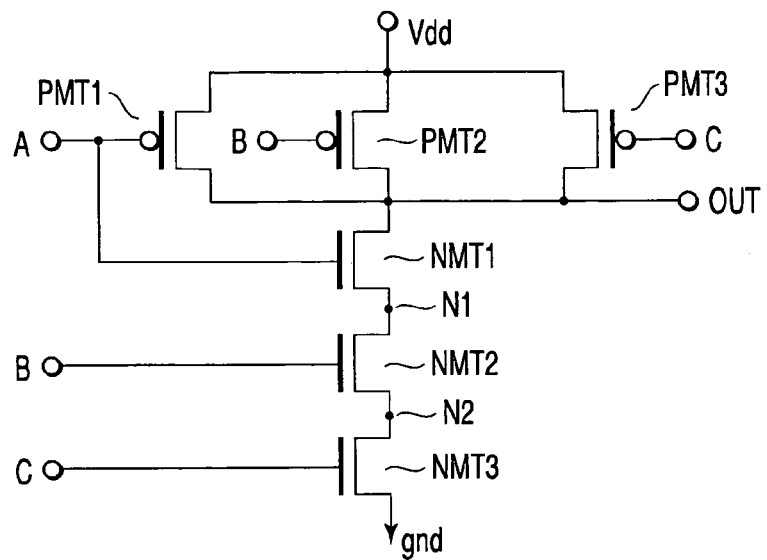
FIG. 22 is an equivalent-circuit diagram of the three-input NAND circuit illustrated in FIG. 20.

FIG. 20 is a plan view of a three-input NAND circuit that is the fifth embodiment of the present invention. FIG. 21 is a sectional view of the three-input NAND circuit depicted in FIG. 20, taken along line XXI—XXI. FIG. 22 is an equivalent-circuit diagram of the three-input NAND circuit illustrated in FIG. 20.

As FIGS. 20 and 21 show, the fourth embodiment has a P-type semiconductor region 6 and two N-type semiconductor regions 7 and 8. As FIG. 21 depicts, gate electrodes GN1, GN2, GN3, GN4, GN5 and GN6 are provided on the P-type semiconductor region 6 via gate insulating films 9, respectively. Gate electrodes GP1, GP2 and GP3 are provided on the N-type semiconductor region 7 via gate insulating films 9, respectively. Gate electrodes GP4, GP5 and GP6 are provided on the N-type semiconductor region 8 via gate insulating films 9, respectively.

NMOS transistors NM1, NM2, NM3, NM4, NM5 and NM6 are provided in the P-type semiconductor region 6.

PMOS transistors PM1, PM2 and PM3 are provided in the N-type semiconductor region 7. PMOS transistors PM4, PM5 and PM6 are provided in the semiconductor region 8.

More specifically, in the P-type semiconductor region 6, n$^+$ diffusion layers DN1 (drain) and DN2 (source) are provided on the sides of the gate electrode GN1, respectively. In the P-type semiconductor region 6, too, the n$^+$ diffusion layer DN2 (drain) and an n$^+$ diffusion layer DN3 (source) are provided on the sides of the gate electrode GN2, respectively. Namely, the source of the NMOS transistor NM2 and the drain of the NMOS transistor NM3 are constituted by the same diffusion layer. Also in the P-type semiconductor region 6, the n$^+$ diffusion layer DN3 (drain) and an n$^+$ diffusion layer DN4 (source) are provided on the sides of the gate electrode GN3, respectively. Thus, the source of the NMOS transistor NM2 and the drain of the NMOS transistor NM3 are constituted by the same diffusion layer. In the P-type semiconductor region, the n$^+$ diffusion layer DN4 (source) and an n$^+$ diffusion layer DN5 (drain) are provided on the side of the gate electrode GN4. Thus, the sources of the NMOS transistors NM3 and NM4 are constituted by the same diffusion layer.

In the P-type semiconductor region 6, the n$^+$ diffusion layer DN5 (source) and an n$^+$ diffusion layer DN6 (drain) are provided on the sides of the gate electrode GN5, respectively. Thus, the drain of the NMOS transistor NM4 and the source of the NMOS transistor NM5 are constituted by the same diffusion layer. In the P-type semiconductor region 6, the n$^+$ diffusion layer DN6 (source) and an n$^+$ diffusion layer DN7 (drain) are provided on the sides of the gate electrode GN6, respectively. Namely, the drain of the NMOS transistor NM5 and the source of the NMOS transistor NM6 are constituted by the same diffusion layer.

In the N-type semiconductor region 7, a p$^+$ diffusion layer DP1 (source) and a p$^+$ diffusion layer DP2 (drain) are provided on the sides of the gate electrode GP1, respectively. Also in the P-type semiconductor region 7, the p$^+$ diffusion layer DP2 (drain) and a p$^+$ diffusion layer DP3 (source) are provided on the sides of the gate electrode GP2. Thus, the drain of the PMOS transistor PM1 and the source of the PMOS transistor PM2 are constituted by the same diffusion layer. In the N-type semiconductor region 7, too, the p$^+$ diffusion layer DP3 (source) and a p$^+$ diffusion layer DP4 (drain) are provided on the sides of the gate electrode GP3. Hence, the source of the PMOS transistor PM2 and the source of the PMOS transistor PM3 are constituted by the same diffusion layer.

In the N-type semiconductor region 8, a p$^+$ diffusion layer DP (drain) and a p$^+$ diffusion layer DP6 (source) are provided on the sides of the gate electrode GP4. In the N-type semiconductor region 8, too, the p$^+$ diffusion layer DP6 (source) and a p$^+$ diffusion layer DP7 (drain) are provided on the sides of the gate electrode GP5, respectively. Thus, the source of the PMOS transistor PM4 and the source of the PMOS transistor PM5 are constituted by the same diffusion layer. In the N-type semiconductor region 8, the p$^+$ diffusion layer DP7 (drain) and a p$^+$ diffusion layer DP8 (source) are provided on the sides of the gate electrode GP6, respectively. Namely, the drain of the PMOS transistor PM5 and the drain of the PMOS transistor PM6 are constituted by the same diffusion layer.

The gate electrodes GN1, GN6, GP3 and GP4 are connected to the input section A. The gate electrodes GN2, GN5, GP2 and GP5 are connected to the input section B. The gate electrodes GN3, GN4, GP1 and GP6 are connected to the input section C.

A wire M1 connects the p$^+$ diffusion layer DP1 to the power-supply voltage Vdd. A wire M2 connects the p$^+$ diffusion layer DP2 to the output section OUT. A wire M3 connects the p$^+$ diffusion layer DP3 to the power-supply voltage Vdd. A wire M4 connects the p$^+$ diffusion layer DP4 and n$^+$ diffusion layer DN1 to the output section OUT. A wire M5 connects the n$^+$ diffusion layer DN2 to a node N1. A wire M6 connects the n$^+$ diffusion layer DN3 to a node N2. A wire M7 connects the n$^+$ diffusion layer DN4 to the ground voltage gnd. A wire M8 connects the n$^+$ diffusion layer DN5 to the node N2. A wire M9 connects the n$^+$ diffusion layer DN6 to the node N1. A wire M10 connects the n$^+$ diffusion layer DN7 and p$^+$ diffusion layer DP6 to the output section OUT. A wire M11 connects the p$^+$ diffusion layer DP6 to the power-supply voltage Vdd. A wire M12 connects the p$^+$ diffusion layer DP7 to the output section OUT. A wire M13 connects the p$^+$ diffusion layer DP8 to the power-supply voltage Vdd.

In the CMOS device thus configured, the transistors NM1 and NM6 constitute an NMOS transistor NMT1, the transistors NM2 and MN5 constitute an NMOS transistor NMT2, and the transistors NM3 and NM4 constitute an NMOS transistor NMT3. Further, the transistors PM3 and PM4 constitute a PMOS transistor PMT1, the transistors PM2 and PM5 constitute a PMOS transistor PMT2, and the transistors PM1 and PM6 constitute a PMOS transistor PMT3. As a result, the transistors NMT1 to NMT3 and transistors PMT1 to PMT3 constitute a three-input NAND circuit.

In the fifth embodiment described above in detail, the gate electrode of each transistor is cut into halves, which are arranged on the element region 4, when the transistors NMT1 to NMT3 and transistors PMT1 to PM3 constitute the three-input NAND circuit. Moreover, the NMOS transistors are arranged in the center part of the element region 4, and the PMOS transistors are arranged in the end parts of the element region 4.

Hence, the carrier mobility can be increased in the NMOS transistors and PMOS transistors in the fifth embodiment. The NMOS transistors and the PMOS transistors can thus have high operating efficiency. These transistors therefore constitute a three-input NAND circuit that can operate at high efficiency.

The P-type semiconductor region 6 may have an even number of NMOS transistors, or at least six NMOS transistors. (That is, the region 6 may have an even number of gate electrodes, or at least six adjacent gate electrodes.) The N-type semiconductor region 7 or the N-type semiconductor region 8, or both, may have at least two PMOS transistors (that is, at least two adjacent gate electrodes).

Figure 23:
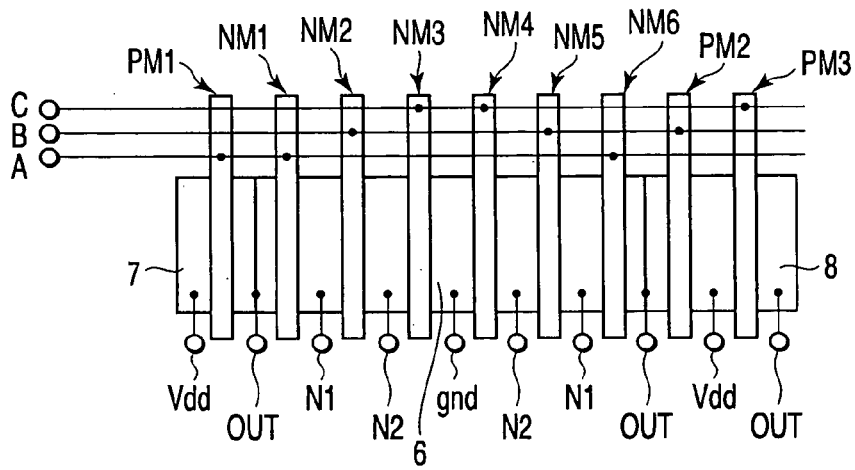
FIG. 23 is a plan view showing another three-input NAND circuit.

Another thee-input NAND circuits according to the fifth embodiment will be described. FIG. 23 is a plan view showing this three-input NAND circuit.

In the three-input NAND circuit of FIG. 23, a PMOS transistor PM1 is provided in the N-type semiconductor region 7. In the N-type semiconductor region 8, PMOS transistors PM2 and PM3 are provided. Thus, the three-input NAND circuit is configured as is illustrated in the equivalent-circuit diagram of FIG. 22. The three-input NAND circuit shown in FIG. 23 differs from the three-input NAND circuit of FIG. 20 in that the gate electrodes of the transistors PMT1 to PMT3 are not cut into halves.

In the three-input NAND circuit of FIG. 23, too, the NMOS transistors and PMOS transistors can have high operating efficiency. In addition, this circuit has fewer electrodes than the three-input NAND circuit shown in FIGS. 20 and 21.

Figure 24:
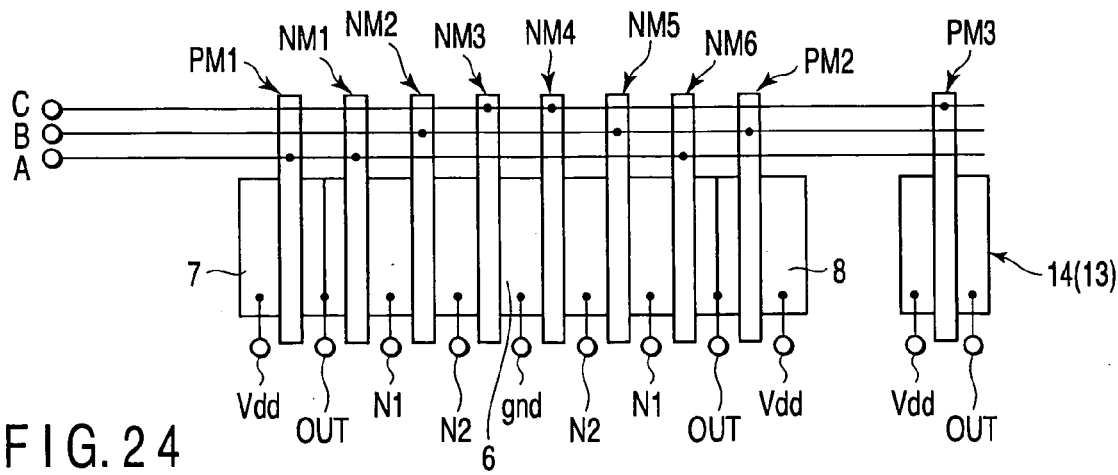
FIG. 24 is a plan view showing still another three-input NAND circuit.

Still another three-input NAND circuit will be described. FIG. 24 is a plan view showing this three-input NAND circuit.

As FIG. 24 depicts, this three-input NAND circuit comprises an SOI substrate. The SOI substrate has a P-type semiconductor region 6 and two N-type semiconductor regions 7 and 8. In the N-type semiconductor region 7, a PMOS transistor PM1 is provided. In the N-type semiconductor region 8, a PMOS transistor PM2 is provided. The SOI substrate includes an Si layer 3. An element region 13 is formed in the Si layer 3. Like the element region 4, the element region 13 is surrounded by an element-isolating region 5. In the element region 13, an N-type semiconductor region 14 has been formed by diffusing N-type impurities at low concentration.

On the element region 13, a gate electrode GP3 is provided, extending in parallel to the gate electrodes that are provided on the element region 4. In the N-type semiconductor region 14, two P-type diffusion layers are formed on the sides of the gate electrode GP3, respectively, thus providing a source and a drain. A PMOS transistor PM3 is thereby formed. The gate electrode GP3, source and drain of the PMOS transistor PM3 are connected to the input section C, the power-supply voltage Vdd and the output section OUT, respectively.

In the three-input NAND circuit of FIG. 24, too, the NMOS transistors and PMOS transistors can operate very efficiently. Arranged in the element region, all PMOS transistors have a particularly high operating efficiency.

Sixth Embodiment

Figure 25:
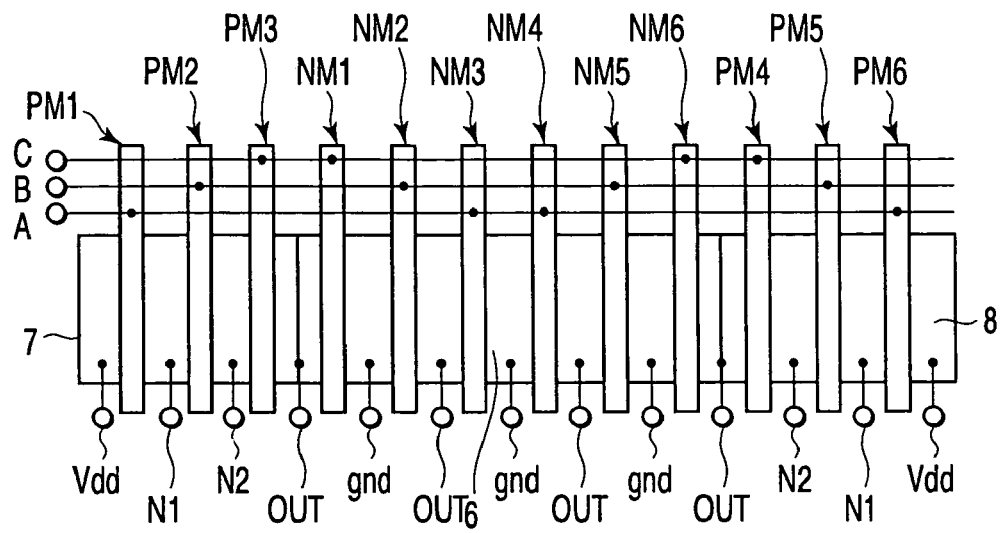
FIG. 25 is a plan view of a three-input NOR circuit according to a sixth embodiment of this invention.
Figure 26:
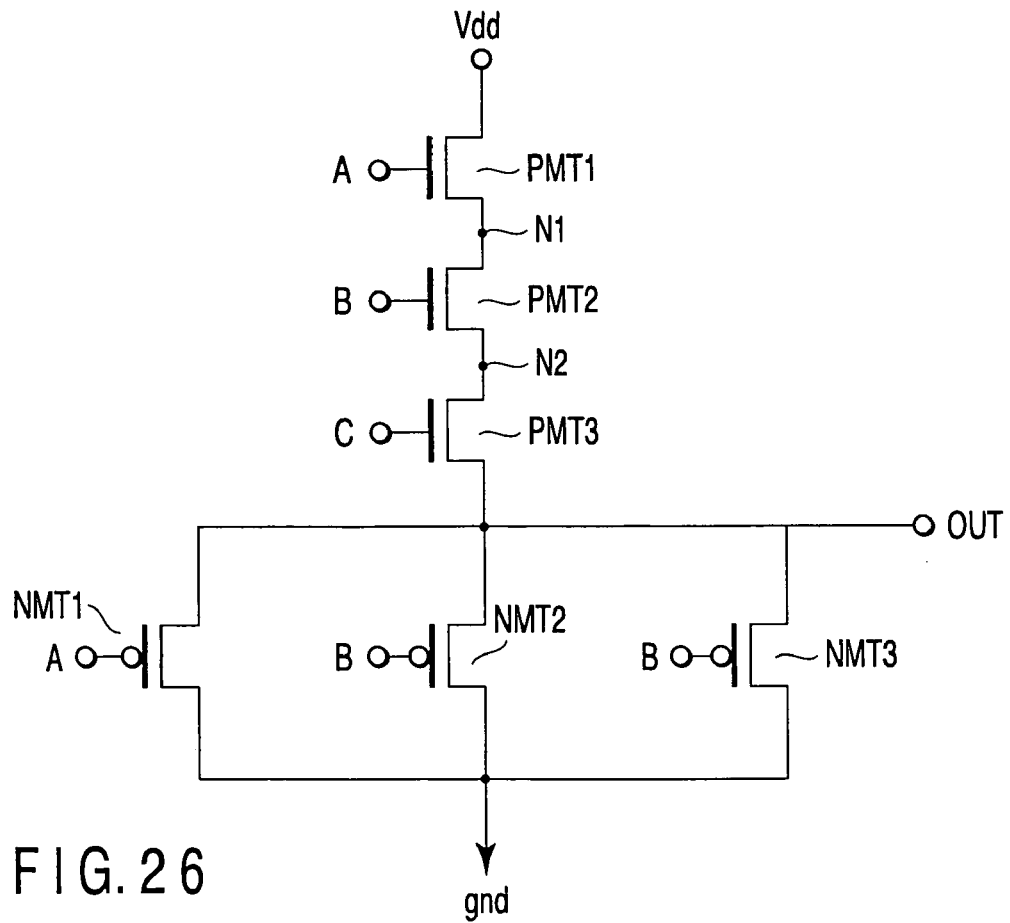
FIG. 26 is an equivalent-circuit diagram of the three-input NOR circuit shown in FIG. 25.

FIG. 25 is a plan view of a three-NOR circuit that is the sixth embodiment of this invention. FIG. 26 is an equivalent-circuit diagram of the three-input NOR circuit shown in FIG. 25. No sectional view of this three-input NAND circuit is presented. This is because the circuit of FIG. 25 has the same structure as shown in FIG. 21, except for the wiring.

As FIGS. 25 and 26 show, the sixth embodiment has a P-type semiconductor region 6 and two N-type semiconductor regions 7 and 8. In the P-type semiconductor region 6, NMOS transistors NM1, NM2, NM4, NM5 and NM6 are provided. In the P-type semiconductor region 7, PMOS transistors PM1, PM2 and PM3 are provided. In the P-type semiconductor region 8, PMOS transistors PM4, PM5 and PM6 are provided.

Gate electrodes GN3, GN4, GP1 and GP6 are connected to the input section A. Gate electrodes GN2, GN5, GP2 and GP5 are connected the input section B. Gate electrodes GN1, GN6, GP3 and GP4 are connected to the input section C.

The source of the transistor PM1 is connected to the power-supply voltage Vdd. The drain of the transistor PM1 and the source of the transistor PM2 are connected to a node N1. The drain of the transistor PM3 and the source of the transistor NM1 are connected to the output OUT. The source of the transistor NM1 and the source of the transistor NM2 are connected to the ground voltage gnd. The drain of the transistor NM1 and the source of the transistor NM2 are connected to the output section OUT. The source of the transistor NM3 and the source of the transistor NM4 are connected to the ground voltage gnd. The drain of the transistor NM4 and the drain of the transistor NM5 are connected to the output section OUT. The source of the transistor NM5 and the source of the transistor NM6 are connected to the ground voltage gnd. The drain of the transistor NM6 and the drain of the transistor PM4 are connected to the output section OUT. The source of the transistor PM4 and the drain of the transistor PM5 are connected to a node N2. The source of the transistor PM5 and the drain of the transistor PM6 are connected to the node N1. The source of the transistor PM6 is the power-supply voltage Vdd.

As seen from the equivalent-circuit diagram of FIG. 26, the transistors PM1 and PM6 constitute a PMOS transistor PMT1. The transistors PM2 and PM5 constitute a PMOS transistor PMT2. The transistors PM3 and PM4 constitute a PMOS transistor PMT3. The transistors NM3 and NM4 constitute an NMOS transistor NMT1. The transistor NM2 and NM5 constitute an NMOS transistor NMT2. The transistors NM1 and NM6 constitute an NMOS transistor NMT3. Thus, a three-input NOR circuit is provided.

In the sixth embodiment described above in detail, the gate electrode of each transistor is cut into halves, which are arranged on the element region 4, when the transistors NMT1 to NMT3 and transistors PMT1 to PM3 constitute the three-input NOR circuit. Moreover, the NMOS transistors are arranged in the center part of the element region 4, and the PMOS transistors are arranged in the end parts of the element region 4.

Hence, the carrier mobility can be increased in the NMOS transistors and PMOS transistors in the sixth embodiment. The NMOS transistors and the PMOS transistors can thus have high operating efficiency. These transistors therefore constitute a three-input NOR circuit that can operate at high efficiency.

The P-type semiconductor region 6 may have an even number of NMOS transistors, or at least six NMOS transistors. (That is, the region 6 may have an even number of gate electrodes, or at least six adjacent gate electrodes.) The N-type semiconductor region 7 or the N-type semiconductor region 8, or both, may have at least two PMOS transistors (that is, at least three adjacent gate electrodes).

Figure 27:
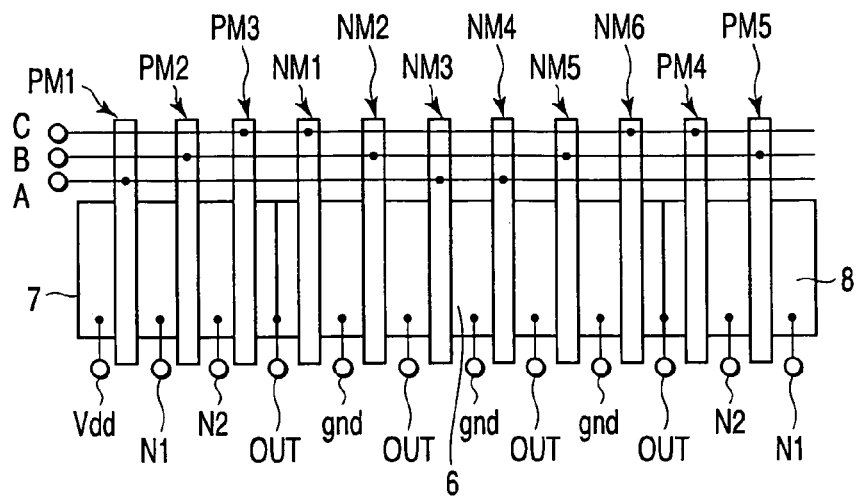
FIG. 27 is a plan view of another three-input NOR circuit.

Another thee-input NOR circuit according to the sixth embodiment will be described. FIG. 27 is a plan view of this three-input NOR circuit.

In the three-input NOR circuit of FIG. 27, the gate electrode of the PMOS transistor PMT1 is not cut into halves, thus being a transistor PM1. Except for this point, this three-input NOR circuit is identical to the three-input NOR circuit shown in FIG. 25.

In the three-input NOR circuit of FIG. 27, too, the NMOS transistors and the PMOS transistors can acquire high operating efficiency. Further, this circuit has fewer electrodes than the three-input NOR circuit shown in FIGS. 25 and 26.

Figure 28:
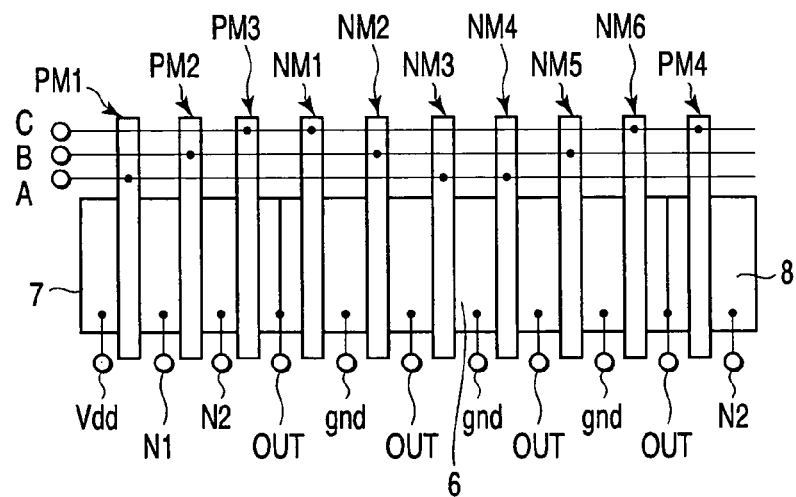
FIG. 28 is a plan view of still another three-input NOR circuit.

Only one gate electrode may be arranged in the N-type semiconductor region 8, thus providing a three-input NOR circuit. FIG. 28 is a plan view of such a three-input NOR circuit.

In the three-input NOR circuit of FIG. 28, the gate electrodes of the PMOS transistors PMT1 and PMT2 are not divided as is depicted in the equivalent-circuit diagram of FIG. 26. Hence, these PMOS transistors are merely transistors PM1 and PM2, respectively. The circuit of FIG. 28 is the same as the circuit of FIG. 25 on any other structural points.

The three-input NOR circuit of FIG. 28 has still fewer gate electrodes. In addition, the PMOS transistors can have still higher operating efficiency, because the PMOS transistor PM4 formed in the N-type semiconductor region 8 are located in only one end part of the element region 4.

Figure 29:
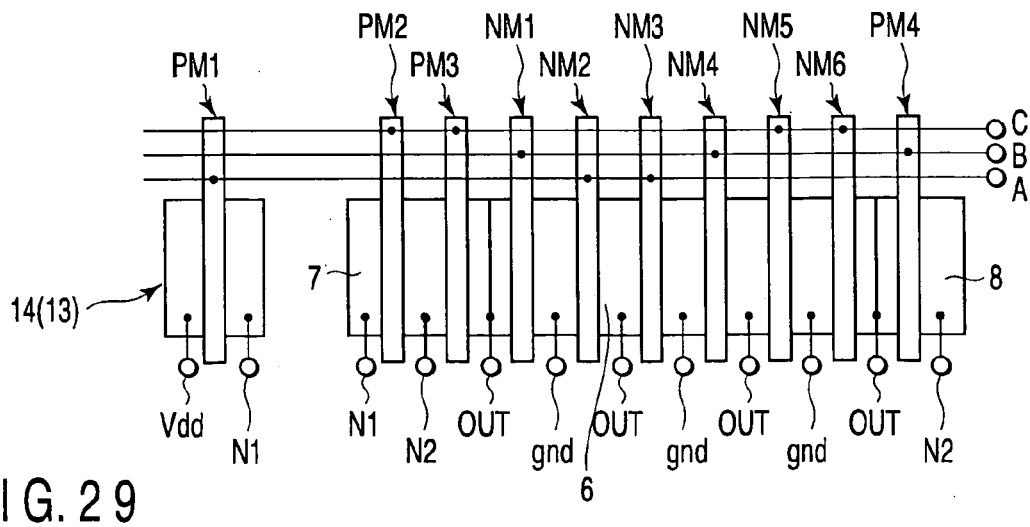
FIG. 29 is a plan view of a further three-input NOR circuit.

Moreover, the transistor PM1 may be formed in an element region 13. FIG. 29 is a plan view of such a three-input NOR circuit.

In the three-input NOR circuit of FIG. 29, three PMOS transistors can be formed in either extreme end part of the element region. Thus located, the PMOS transistors can operate better than in the three-input NOR circuit of FIG. 28.

Figure 30:
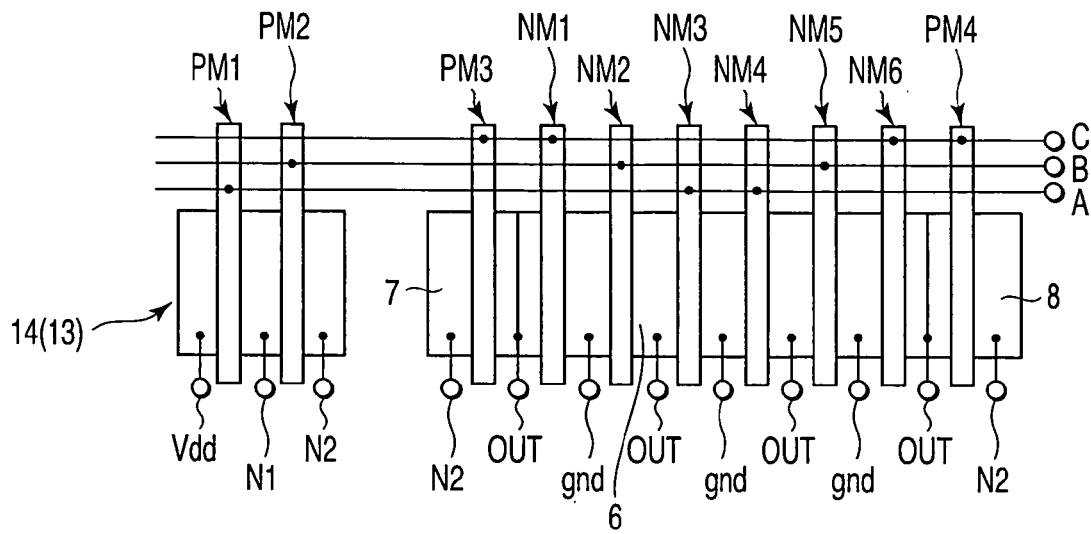
FIG. 30 is a plan view of another three-input NOR circuit.

Furthermore, the transistor PM2 may be formed in the element region 13. FIG. 30 is a plan view o such a three-input NOR circuit.

In the three-input NOR circuit of FIG. 30, all PMOS transistors are provided in the extreme ends of the element region. The PMOS transistors can therefore operate better than in the three-input NOR circuit of FIG. 29.

Seventh Embodiment

Figure 31:
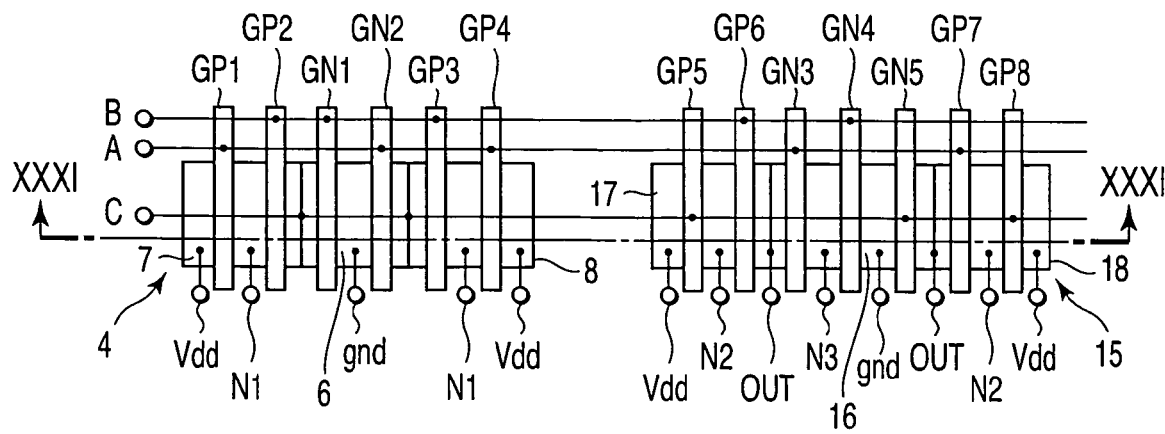
FIG. 31 is a plan view of a two-input XOR circuit according to a seventh embodiment of the present invention.
Figure 32:
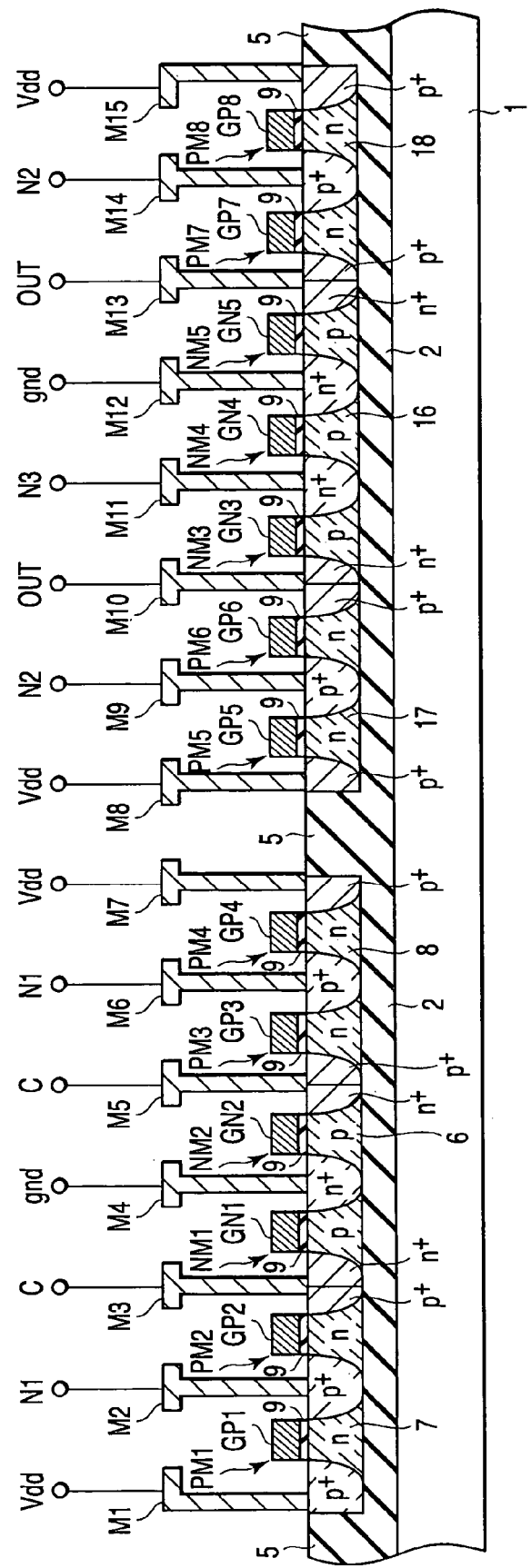
FIG. 32 is a sectional view of the two-input XOR circuit shown in FIG. 31, taken along line XXXII—XXXII.

FIG. 31 is a plan view of a two-input exclusive OR circuit (hereinafter referred to as "two-input XOR circuit") according to a seventh embodiment of the present invention. FIG. 32 is a sectional view of the two-input XOR circuit, taken along line XXXII—XXXII in FIG. 31. FIG. 33 is an equivalent-circuit diagram of the two-input XOR circuit shown in FIG. 31.

The two-input XOR circuit is provided in an SOI substrate having an Si layer 3. In the Si layer 3, two element regions 4 and 15 are provided. Like the element region 4, the element region 15 is a sandwich structure composed of a P1 block, an N block and a P2 block. In the element region 15, a P-type semiconductor region 16 and two N-type semiconductor regions 17 and 18 are formed.

The element region 4 consists of an P-type semiconductor region 6 and two N-type semiconductor regions 7 and 8. In the P-type semiconductor region 6, NMOS transistors NM1 and NM2 are provided. In the N-type semiconductor region 7, PMOS transistors PM1 and PM2 are provided. In the N-type semiconductor region 8, PMOS transistors PM3 and PM4 are provided.

In the P-type semiconductor region 16, NMOS transistors NM3, NM4 and NM5 are provided. In the N-type semiconductor region 17, PMOS transistors PM5 and PM6 are provided. In the N-type semiconductor region 18, PMOS transistors PM7 and PM8 are provided.

Gate electrodes GN2, GN3, GP1, GP4 and GP7 are connected to the input section A. Gate electrodes GN1, GN4, GP2, GP3 and GP6 are connected to the input section B. Gate electrodes GN4, GP5 and GP8 are connected to the connection section C.

The source of the transistor PM1 is connected to the power-supply voltage Vdd. The drain of the transistor PM1 and the source of the transistor PM2 are connected to a node N1. The drain of the transistor PM2 and the drain of the transistor NM1 are connected to the connection section C. The source of the transistor NM1 and the source of the transistor NM2 are connected to the ground voltage gnd. The drain of the transistor NM2 and the drain of the transistor PM3 are connected to the connection section C. The source of the transistor PM3 and the drain of the transistor PM4 are connected to the node N1. The source of the transistor PM4 is connected to the power-supply voltage Vdd.

The source of the transistor PM5 is connected to the power-supply voltage Vdd. The drain of the transistor PM5 and the source of the transistor PM6 are connected to a node N2. The drain of the transistor PM6 and the drain of the transistor NM3 connected to the output section OUT. The source of the transistor MN3 and the drain of the transistor NM4 are connected to a node N3. The source of the transistor NM4 and the source of the transistor NM5 are connected to the ground voltage gnd. The drain of the transistor NM5 and the drain of the transistor PM7 are connected to the output section OUT. The source of the transistor PM7 and the drain of the transistor PM8 are connected to the node N2. The source of the transistor PM8 is connected to the power-supply voltage Vdd.

The PMOS transistor PMT1 shown in the equivalent-circuit diagram of FIG. 33 is composed of the transistors PM1 and PM4. The PMOS transistor PMT2 is composed of the transistors PM2 and PM3. The PMOS transistor PMT3 is composed of the transistors PM5 and PM8. Thus, a two-input XOR circuit is constituted.

In the seventh embodiment, the gate electrodes of the PMOS transistors PMT1 to PMT3 are cut into halves, each, thus providing the two-input XOR circuit. The NMOS transistors are arranged in the center part of each element region, and the PMOS transistors are arranged in the end parts of each element region.

Hence, the carrier mobility can be increased in the NMOS transistors and PMOS transistors in the seventh embodiment. As a result, the NMOS transistors and the PMOS transistors can have high operating efficiency. These transistors therefore constitute a two-input XOR circuit that can operate at high efficiency.

In either element region, the NMOS transistors can therefore be positioned symmetrical to the PMOS transistors. Hence, the two-input XOR circuit is a CMOS device that exhibits almost the same characteristics as designed.

Another two-input XOR circuit will be described. FIG. 34 is a plan view of this two-input XOR circuit.

The two-input XOR circuit of FIG. 34 is identical to the circuit of FIG. 33, except that the PMOS transistor PMT3 is constituted by a transistor PM5 only.

In the two-input XOR circuit of FIG. 34, too, the NMOS transistors and PMOS transistors can have high operating efficiency. Moreover, this circuit has fewer gate electrodes than the two-input XOR circuit illustrated in FIGS. 31, 32 and 33. The two-input OX circuits shown in FIGS. 31 and 34 can be interchangeably used in accordance with the substrate area or the performance desired.

Eighth Embodiment

Figure 35:
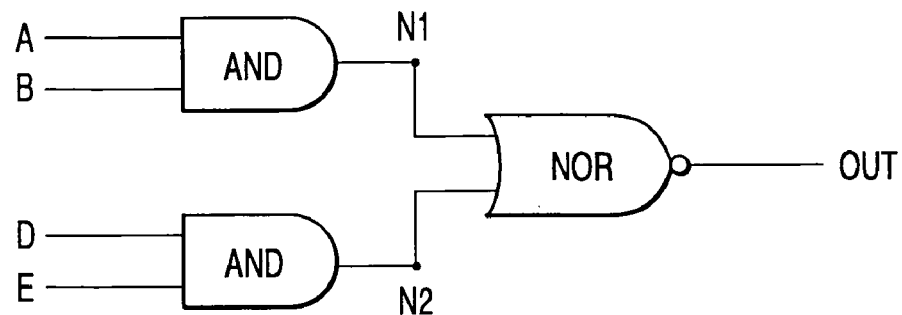
FIG. 35 is a circuit diagram of an AND-NOR circuit according to an eighth embodiment of this invention.

This embodiment is an AND-NOR circuit that is constituted by some of the circuits descried thus far. FIG. 35 is a circuit diagram of the AND-NOR circuit.

As FIG. 35 shows, the AND-NOR circuit comprises two AND circuits and one NOR circuit. Two input sections A and B are connected to one AND circuit. Two input sections C and D are connected to the other AND circuit. The outputs of the AND circuits are connected to the inputs of the NOR circuit. This, a four-input AND-NOR circuit is provided.

Figure 36:
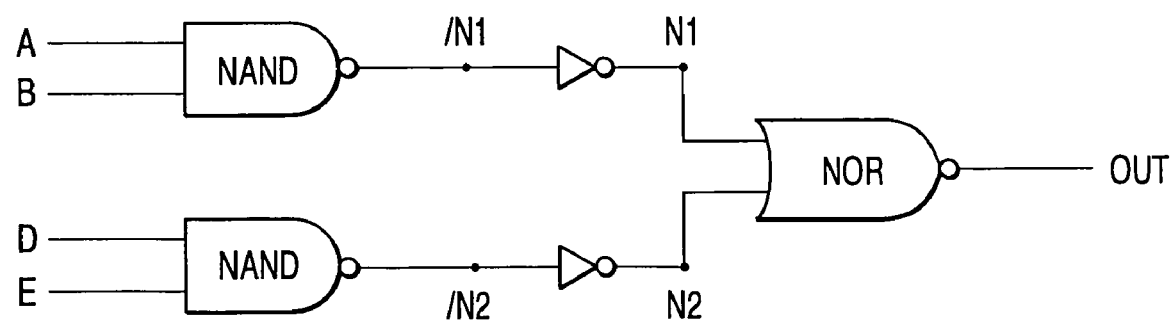
FIG. 36 is a circuit diagram of an AND-NOR circuit that is identical to the circuit of FIG. 35, except a NAND circuit and an inverter circuit replace one AND circuit.

FIG. 36 is a circuit diagram of an AND-NOR circuit that is identical to the circuit of FIG. 35, except a NAND circuit and an inverter circuit replace one AND circuit. Since each NAND circuit and the inverter connected to the output thereof constitute an AND circuit, the circuit of FIG. 36 performs the same function as the AND-NOR circuit shown in FIG. 35. In FIG. 36, "/N1" denotes data logically inverse to the data input to the node N1, and "/N2" denote data logically inverse to the data input to the node N2.

Figure 37:
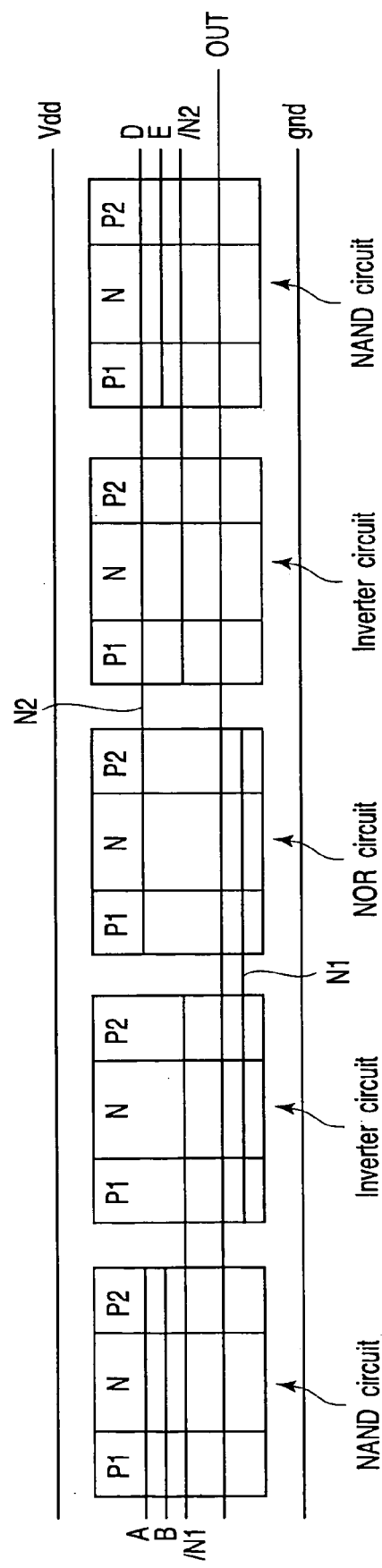
FIG. 37 is a layout diagram of the AND-NOR circuit illustrated in FIG. 36.

FIG. 37 is a layout diagram of the AND-NOR circuit illustrated in FIG. 36. The NAND circuits, inverter circuits and NOR circuit, all shown in FIG. 37, are those described earlier. In FIG. 37, the line for applying the power-supply voltage Vdd and the line for applying the ground voltage gnd are illustrated for explaining a layout, but the wires that connect these lines to the NAND circuits, inverter circuits and NOR circuit are not shown.

As evident from FIG. 37, the NAND circuits, inverter circuits and NOR circuit are combined, providing an AND-NOR circuit. As has been pointed out, the NAND circuits, inverter circuits and NOR circuit are so configured that the constituent NMOS transistors and PMOS transistors have high operating efficiency. Composed of these circuits, the AND-NOR circuit operates well and exhibits almost the same characteristics as designed.

Ninth Embodiment

Figure 38:
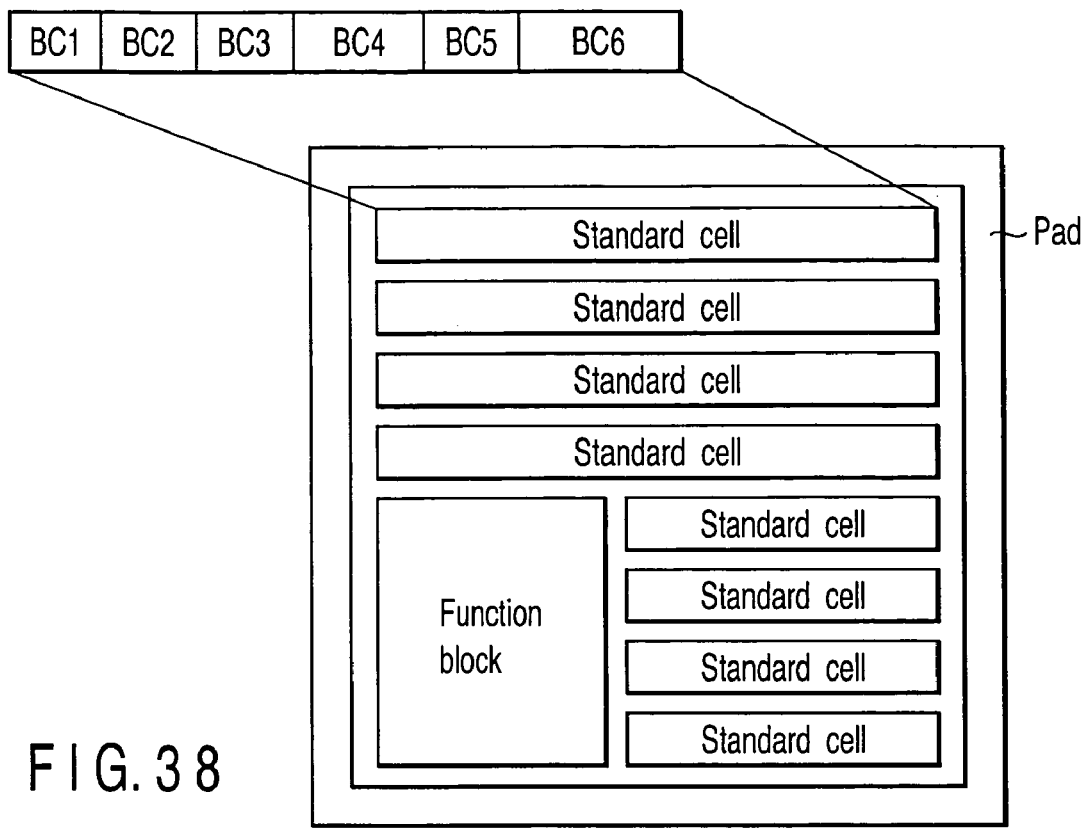
FIG. 38 is a layout diagram of a semiconductor integrated circuit.

The ninth embodiment is a semiconductor integrated circuit that comprises a plurality of basic cells defined above. FIG. 38 is a layout diagram of the semiconductor integrated circuit.

The semiconductor integrated circuit comprises a function block, a pad, and standard cells. The pad is to be connected to external circuits. Wires (not shown) connect the function block, the pad and the standard cells. Each standard cell includes a plurality of basic cells BC. The basic cells BC are selected from the inverter circuits, NAND circuits, NOR circuits and XOR circuits according to the above-described embodiments. Each standard cell need not have circuits of the same configuration. Rather, it may have basic cells that are different circuits. Further, each standard cell may include any number of basic cells BC. The basic cells BC constituting each standard cell are electrically isolated by element-isolating regions (not shown).

Thus, the semiconductor integrated circuit can easily be made by using basic cells. The circuit can be a high-performance, large-scale integrated circuit. In addition, it can be used as a cell-based ASIC (Application Specific Integrated Circuit).

Tenth Embodiment

Figure 39:
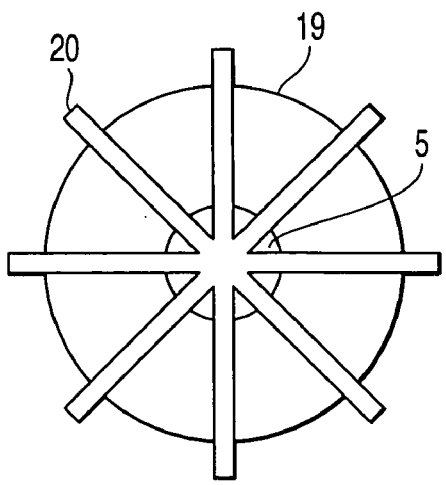
FIG. 39 is a plan view of a COMS device according to the tenth embodiment of the invention.

The tenth embodiment of the invention is a CMOS device that has a doughnut-shaped element region. In the CMOS device, the gate electrodes extend in radial directions from the center of the element region. FIG. 39 is a plan view of the CMO device according to the tenth embodiment.

This CMOS device is provided in an SOI substrate having an Si layer 3. In the Si layer 3, a doughnut-shaped element region 19 is provided. A circular element-isolating region 5 contacts the inner periphery of the element region 19. The element region 19 is surrounded, at the outer periphery, by another element-isolating region (not shown). A gate insulating film (not shown) is provided on the element region 19. Gate electrodes 20 are provided on the gate insulating film, each extending in a radial direction. The gate electrodes 20 are connected together at the center of the element region 19.

Figure 40:
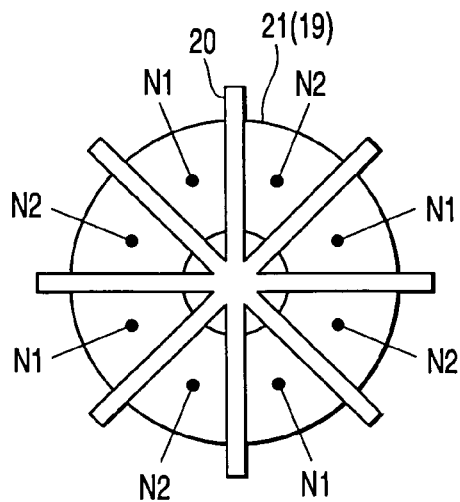
FIG. 40 is a plan view of NMOS transistors incorporated in the CMOS device of FIG. 39.
Figure 41:
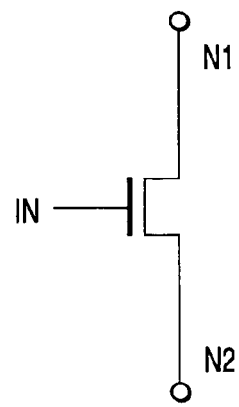
FIG. 41 is an equivalent-circuit diagram of one of the NMOS transistors shown in FIG. 40.

FIG. 40 is a plan view of NMOS transistors incorporated in the CMOS device of FIG. 39. FIG. 41 is an equivalent-circuit diagram of one of the NMOS transistors shown in FIG. 40. P-type impurities have been diffused into the element region 19, forming a P-type semiconductor region 21. Several n$^+$ diffusion layers are formed, respectively, in those parts of the P-type semiconductor region 21, which lie between the gate electrodes 20. Nodes N1 and N2 are alternately connected to the n$^+$ diffusion layers. The gates 20 are connected to an input section IN. Thus, NMOS transistors of the type shown in FIG. 41 are formed. PMOS transistors can be formed in similar way, by using impurities of the opposite conductivity type, i.e., N-type impurities.

Figure 42:
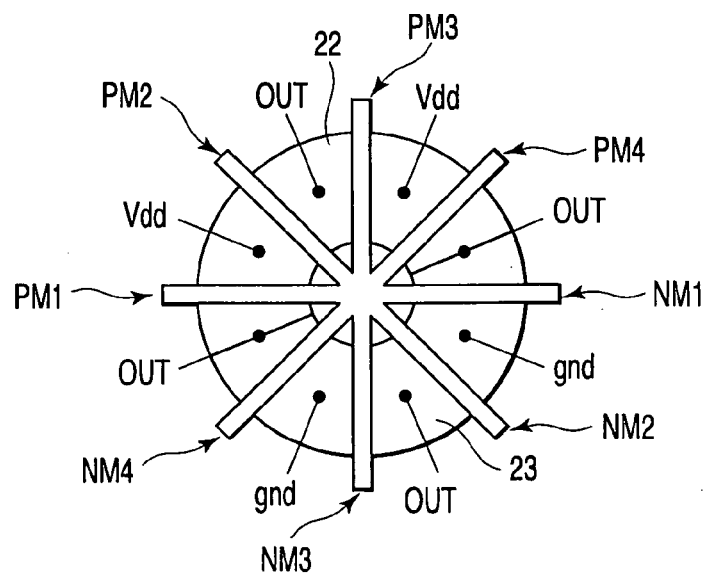
FIG. 42 is a plan view of an inverter circuit constituted by using the CMOS device of FIG. 39.

The CMOS device of FIG. 39 can be modified into an inverter circuit. FIG. 42 is a plan view of such an inverter circuit. The configuration of the inverter circuit of FIG. 42 is represented by the equivalent-circuit diagram of FIG. 7.

As can be understood from FIG. 42, N-type impurities have been diffused into one half of the element region 19 at low concentration, forming an N-type semiconductor region 22. P-type impurities have been diffused into the other half of the element region 19, forming a P-type semiconductor region 23. In the N-type semiconductor region 22, PMOS transistors PM1 to PM4 are formed. The source of each PMOS transistor and the drain of the adjacent PMOS transistor are constituted by the same p$^+$ diffusion layer. NMOS transistors NM1 to NM4 are formed in the semiconductor region 23. In the P-type semiconductor region 23, NMOS transistors MN1 to NM4 are formed. The source of each NMOS transistor and the drain of the adjacent NMOS transistor are constituted by the same n$^+$ diffusion layer.

As indicated above, the gate electrodes 20 extend in radial directions on the doughnut-shaped element region 19. Hence, the ends of element region do not extend parallel to the direction of the channel width. Thus, the gate electrodes are equidistantly spaced from the ends of the element region 19. If PMOS transistors and NMOS transistors are formed in the element region 19, or if an inverter circuit having PMOS transistor and NMOS transistors is formed in the element region 19, the PMOS transistors will have almost the same characteristics, and so will do the NMOS transistors. Therefore, these transistors have stable operating efficiency, and the inverter circuit has stable operating efficiency, too.

Figure 43:
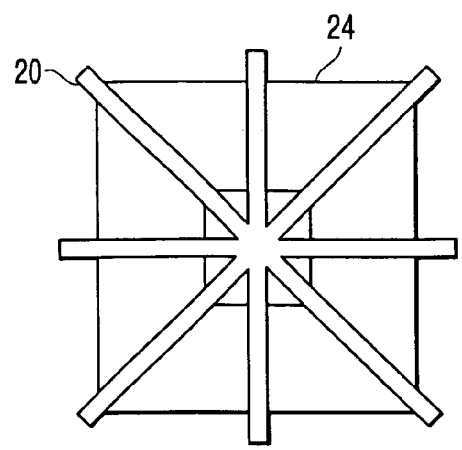
FIG. 43 is a plan view of a CMOS device having a square element region that is equivalent to the element region shown in FIG. 39.

The element region 19 may be square or rectangular, not circular as shown in FIG. 40. FIG. 43 is a plan view of a CMOS device that has a square element region 24. Transistors or an inverter circuit may be formed in the square element region 24. In this case, too, the same advantage will be attained as in the CMOS device of FIG. 39.

Figure 44:
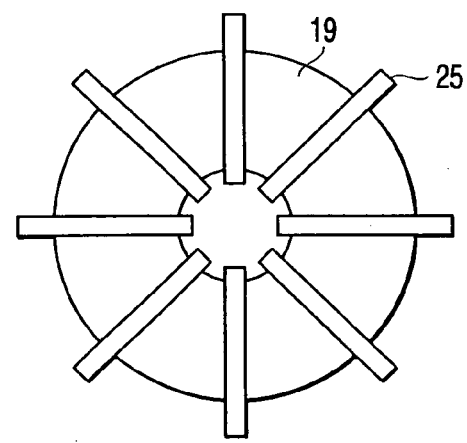
FIG. 44 is a plan view of a CMOS device that differs from the CMOS device of FIG. 39 in that the gate electrodes are not connected at the center part of the device.

The gate electrodes 20 need not be connected at the center of the element region 19. FIG. 44 is a plan view of a CMOS device that differs from the CMOS device of FIG. 39 in that the gate electrodes are not connected at the center part of the element region. As FIG. 44 shows, gate electrodes 25 provided on a gate insulating film (not shown) formed on the element region 19 extend in radial direction, but are not connected together at the center of the element region 19. In the CMOS device of FIG. 44, too, the gate electrodes are equidistantly spaced from the ends of the element region 19.

Figure 45:
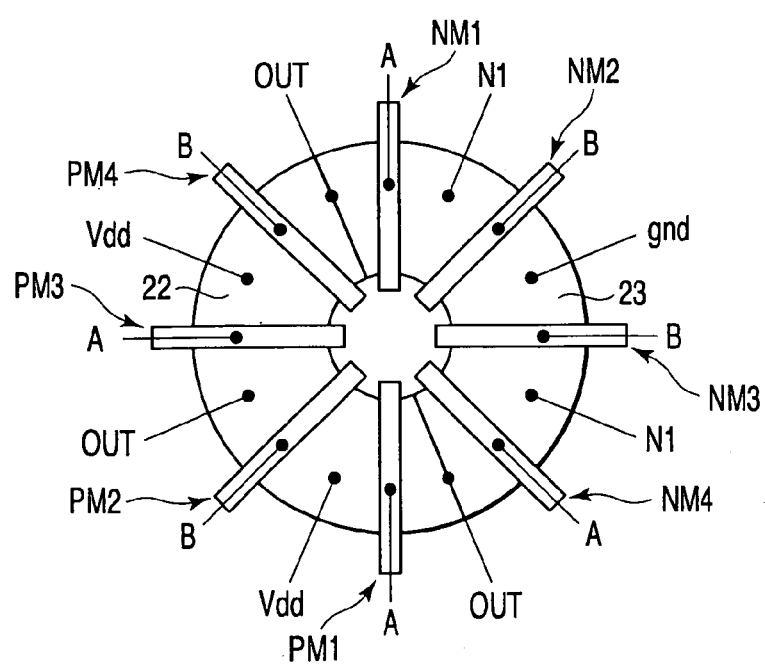
FIG. 45 is a plan view of a two-input NAND circuit having the CMOS device of FIG. 44.

FIG. 45 is a plan view of a two-input NAND circuit having the CMOS device of FIG. 44. The configuration of this two-input NAND circuit is represented by the equivalent-circuit diagram of FIG. 10.

N-type impurities have been diffused into one half of the element region 19 at low concentration, forming an N-type semiconductor region 22. P-type impurities have been diffused into the other half of the element region 19, forming a P-type semiconductor region 23. PMOS transistors PM1 to PM4 are formed in the N-type semiconductor region 22. The source or drain of each PMOS transistor and the source or drain of the adjacent PMOS transistor are constituted by the same p$^+$ diffusion layer. In the P-type semiconductor region 23, NMOS transistors MN1 to NM4 are formed. The source or drain of each NMOS transistor and the source or drain of the adjacent NMOS transistor are constituted by the same n$^+$ diffusion layer.

In the two-input NAND circuit thus configured, the PMOS transistors can have almost the same characteristics, and the NMOS transistors can have almost the same characteristic, too. The two-input NAND circuit can therefore acquire stable operating efficiency.

Figure 46:
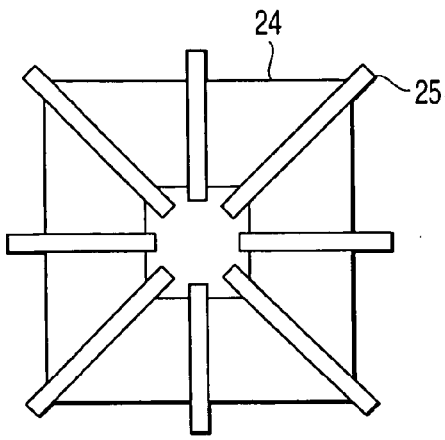
FIG. 46 is a plan view of a CMOS device that differs from the device of FIG. 44 in that the element region is square.

The element region may be square or rectangular, not circular as shown in FIG. 45. FIG. 46 is a plan view of a CMOS device that has a square element region 24. A two-input NAND circuit may be formed in the square element region 24. This two-input NAND circuit can have the same advantage as the two-input NAND circuit illustrated in FIG. 45.

Eleventh Embodiment

Figure 47:
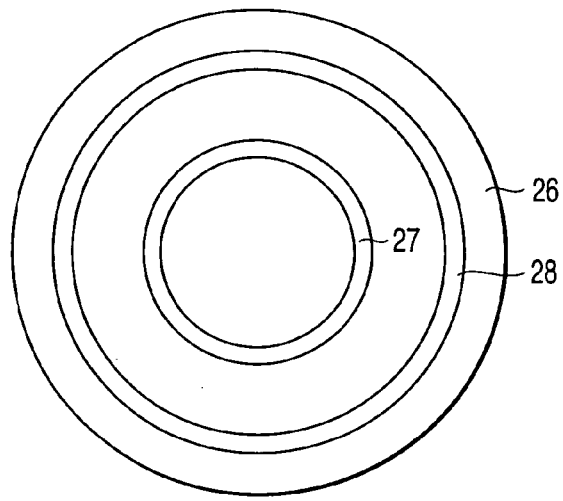
FIG. 47 is a plan view of a CMOS device according to an eleventh embodiment of this invention.

The eleventh embodiment of the invention is a CMOS device that has a circular element region. FIG. 47 is a plan view of this CMOS device.

This CMOS device is provided in an SOI substrate having an Si layer 3. In the Si layer 3, a circular element region 26 is provided. The element region 26 is surrounded by an element-isolating region (not shown). A gate electrode 27 shaped like a ring is provided on the center part of the element region 26. The gate electrode 27 will be used in an NMOS transistor. A gate electrode 28 shaped like a ring, too, is provided on the element region 26 and located near the peripheral edge of the element region 26. This gate electrode 28 will be used in a. PMOS transistor.

Thus, a PMOS transistor is provided in the peripheral part of the circular element region 26, and an NMOS transistor is provided in the center part of the element region 26. Thus provided in the circular element region 26, both PMOS transistor and NMOS transistor can have high operating efficiency.

Figure 48:
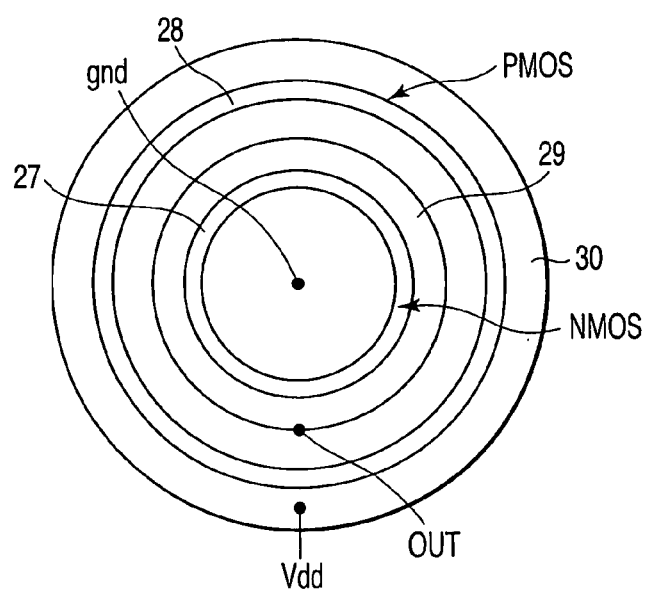
FIG. 48 is a plan view depicting an inverter circuit that has the CMOS device shown in FIG. 47.
Figure 50:
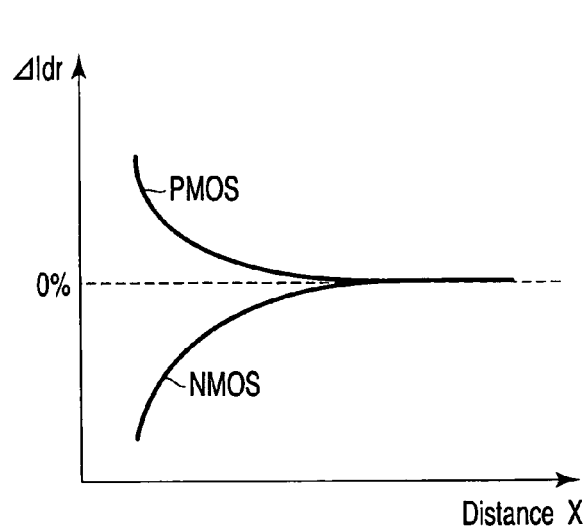
FIG. 50 is a graph showing a relation between current drivability and distance from either edge of the element region, for PMOS transistors and NMOS transistors.
Figure 51:
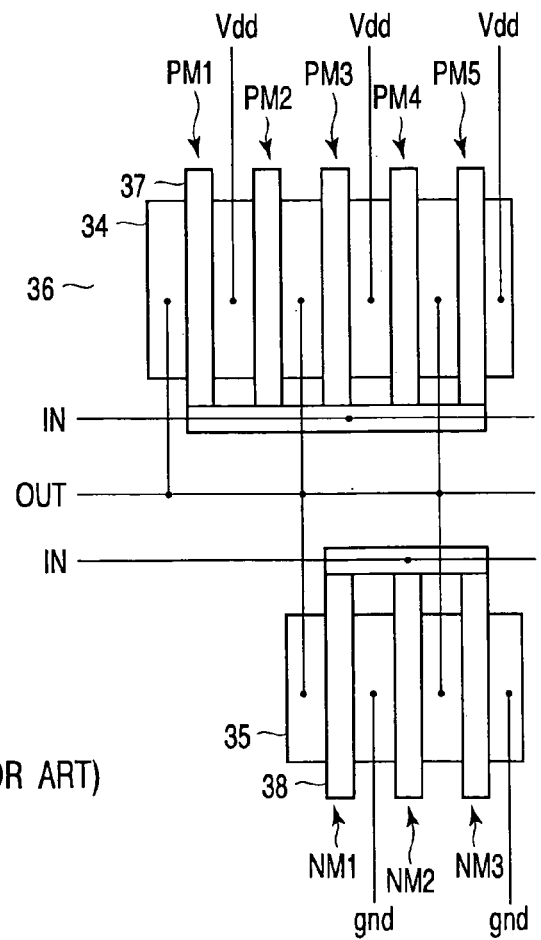
FIG. 51 is a plan view of a conventional inverter circuit.

FIG. 48 is a plan view depicting an inverter circuit that has the CMOS device shown in FIG. 47. The configuration of this inverter circuit is represented by the equivalent-circuit diagram of FIG. 7.

P-type impurities have been diffused at low concentration into the center part of the element region 26, thus forming a P-type semiconductor region 29. N-type impurities have been diffused at low concentration into the remaining part of the element region 26, forming an N-type semiconductor region 30.

An annular gate electrode 27 is provided on the P-type semiconductor region 29 via a gate insulating film. In the P-type semiconductor region 29, two n$^+$ diffusion layers are formed on the sides of the gate electrode 27, respectively, thus providing a source and a drain. An annular gate electrode 28 is provided on the N-type semiconductor region 30 via a gate insulating film. In the N-type semiconductor region 30, two p$^+$ diffusion layers are formed on the sides of the gate electrode 28, respectively, thus providing a source and a drain.

In the inverter circuit thus configured, the carrier mobility can be increased in the NMOS transistors and PMOS transistors. The NMOS transistors and the PMOS transistors can therefore have high operating efficiency. These transistors constitute a two-input inverter circuit that can operate at high efficiency.

The element region may be square or rectangular, not circular as shown in FIG. 48. FIG. 49 is a plan view of a CMOS device that has a square element region 31. Two gate electrodes 32 and 33, both shaped like a frame, are provided on the square element region 31. An inverter circuit having the square element region 31 can achieve the same advantage as the inverter circuit of FIG. 48.

The gate electrodes 27 and 28 need not be complete rings. Rather, they may be cut at a part.

In each of the embodiments described above, the NMOS transistors and PMOS transistors have the same gate width W. Nonetheless, they may have different gate widths. Moreover, the element region may be changed in size and shape so that the transistors formed in this region may have different gate widths W. In this case, too, the advantages of this invention can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a substrate having an insulating layer and an active layer provided on the insulating layer;
   a first element region provided in the active layer;
   an element-isolating region provided in the active layer, surrounding the first element region and reaching the insulating layer;
   a P-type semiconductor region provided in the first element region and reaching the insulating layer;
   first and second N-type semiconductor regions provided in end parts of the P-type semiconductor region, respectively, spaced apart in a first direction, provided in the first element region, and reaching the insulating layer;
   at least one N-type MOS transistor provided in the P-type semiconductor region and having a first gate electrode provided on the P-type semiconductor region, a direction of a channel length of the N-type MOS transistor substantially corresponding to the first direction;
   at least one first P-type MOS transistor provided in the first N-type semiconductor region and having a second gate electrode provided on the first N-type semiconductor region, a direction of a channel length of the first P-type MOS transistor substantially corresponding to the first direction; and
   at least one second P-type MOS transistor provided in the second N-type semiconductor region and having a third gate electrode provided on the second N-type semiconductor region, a direction of a channel length of the second P-type MOS transistor substantially corresponding to the first direction,
   wherein the element-isolating region is not provided between the P-type semiconductor region and the first N-type semiconductor region, and between the P-type semiconductor region and the second N-type semiconductor region.

2. The semiconductor device according to claim 1, wherein the N-type MOS transistor, first P-type MOS transistor and second P-type MOS transistor constitute a CMOS logic circuit.

3. The semiconductor device according to claim 1, wherein the N-type MOS transistor comprises two transistors, and the N-type MOS transistor, first P-type transistor and second P-type transistor constitute an inverter circuit.

4. The semiconductor device according to claim 1, wherein the N-type MOS transistor comprises an even number of transistors, which is at least 2, and the N-type MOS transistor, first P-type MOS transistor and second P-type MOS transistor constitute an inverter circuit.

5. The semiconductor device according to claim 1, wherein the N-type MOS transistor comprises four transistors, and the N-type MOS transistor, first P-type MOS transistor and second P-type MOS transistor constitute a two-input NAND circuit.

6. The semiconductor device according to claim 1, wherein the N-type MOS transistor comprises an even number of transistors, which is at least 4, and the N-type MOS transistor, first P-type MOS transistor and second P-type MOS transistor constitute a two-input NAND circuit.

7. The semiconductor device according to claim 1, wherein the N-type MOS transistor comprises two transistors, the first P-type MOS transistor comprises two transistors, and the N-type MOS transistor, first P-type MOS transistor and second P-type MOS transistor constitute a two-input NOR circuit.

8. The semiconductor device according to claim 7, wherein the second P-type MOS transistor comprises two transistors, and the N-type MOS transistor, first P-type MOS transistor and second P-type MOS transistor constitute a two-input NOR circuit.

9. The semiconductor device according to claim 1, wherein the N-type MOS transistor comprises an even number of transistors, which is at least 2, and at least one of the first and second P-type MOS transistors comprises at least two transistors, and the N-type MOS transistor, first P-type MOS transistor and second P-type MOS transistor constitute a two-input NOR circuit.

10. The semiconductor device according to claim 1, wherein the N-type MOS transistor comprises six transistors, the second P-type MOS transistor comprises two transistors, and the N-type MOS transistor, first P-type MOS transistor and second P-type MOS transistor constitute a three-input NAND circuit.

11. The semiconductor device according to claim 1, wherein the N-type MOS transistor comprises six transistors, the first P-type MOS transistor comprises three transistors, the second P-type MOS transistor comprises three transistors, and the N-type MOS transistor, first P-type MOS transistor and second P-type MOS transistor constitute a three-input NAND circuit.

12. The semiconductor device according to claim 1, further comprising:
 a second element region provided in the active layer;
 a third N-type semiconductor region provided in the second element region and reaching the insulating layer; and
 a third P-type MOS transistor provided in the third N-type semiconductor region and having a fourth electrode provided on the third N-type semiconductor region,
 wherein the N-type MOS transistor comprises six transistors, and the N-type MOS transistor, first P-type MOS transistor and second P-type MOS transistor constitute a three-input NAND circuit.

13. The semiconductor device according to claim 1, wherein the N-type MOS transistor comprises an even number of transistors, which is at least 6, at least one of the first and second P-type MOS transistors comprises at least two transistors, and the N-type MOS transistor, first P-type MOS transistor and second P-type MOS transistor constitute a three-input NAND circuit.

14. A semiconductor device comprising:
 a substrate having an insulating layer and an active layer provided on the insulating an element region provided in the active layer;
 an element-isolating provided in the active layer, surrounding the element region and reaching the insulating layer;
 a P-type semiconductor region provided in the element region and reaching the insulating layer;
 a(n) plurality of N-type semiconductor regions provided in the element region, surrounding the P-type semiconductor region on either side, and reaching the insulating layer;
 an N-type MOS transistor provided in the P-type semiconductor region and having a first gate electrode provided on the P-type semiconductor region;
 and a P-type MOS transistor provided in the N-type semiconductor region and having a second gate electrode provided on the N-type semiconductor region:
 wherein the element-isolating region is not provided between the P-type semiconductor region and each of the plurality of N-type semiconductor regions.

15. A semiconductor device comprising:
 a substrate having an insulating layer and an active layer provided on the insulating an element region provided in the active layer and having a space in a center part;
 an element-isolating region provided in the active layer and the space of the element region, surrounding the element region and reaching the insulting layer;
 and a P-type semiconductor region provided in the element region and reaching the insulating layer;
 a(n) plurality of N-type semiconductor regions provided in the element region and reaching the insulating layer;
 an N-type MOS transistor provided in the P-type semiconductor region and having a first gate electrode provided on the P-type semiconductor region;
 and a P-type MOS transistor provided in the N-type semiconductor region and having a second gate electrode provided on the N-type semiconductor region,
 wherein the gate electrodes extend in radial directions from the center part of the element region, and the element-isolating region is not provided between the P-type semiconductor region and each of the plurality N-type semiconductor regions.

16. The semiconductor device according to claim 1, wherein the element-isolating region electrically isolates the first element region from an element region adjacent to the first element region.

17. The semiconductor device according to claim 1, wherein the P-type semiconductor region and the first and second N-type semiconductor regions are provided in a single element region.

18. The semiconductor device according to claim 1, wherein the first element region is independently provided on the insulating layer.

19. The semiconductor device according to claim 1, wherein the N-type MOS transistor is provided in a center part of the first element region.

20. The semiconductor device according to claim 1, wherein the first and second P-type MOS transistors are provided in an edge part of the first element region.

* * * * *